(12) United States Patent
Van de Ven et al.

(10) Patent No.: US 8,511,851 B2
(45) Date of Patent: Aug. 20, 2013

(54) HIGH CRI ADJUSTABLE COLOR TEMPERATURE LIGHTING DEVICES

(75) Inventors: Antony P. Van de Ven, Sai Kung (HK); Gerald Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 407 days.

(21) Appl. No.: 12/643,705

(22) Filed: Dec. 21, 2009

(65) Prior Publication Data

US 2011/0148327 A1 Jun. 23, 2011

(51) Int. Cl.
*F21V 9/00* (2006.01)

(52) U.S. Cl.
USPC .......................................... 362/231; 362/230

(58) Field of Classification Search
USPC ......................... 362/231, 230, 253; 315/312
See application file for complete search history.

(56) References Cited

U.S. PATENT DOCUMENTS

| | | | |
|---|---|---|---|
| 4,946,547 A | 8/1990 | Palmour et al. | 156/643 |
| 5,200,022 A | 4/1993 | Kong et al. | 156/612 |
| 5,278,432 A | 1/1994 | Ignatius et al. | 257/88 |
| RE34,861 E | 2/1995 | Davis et al. | 437/100 |
| 5,453,405 A | 9/1995 | Fan et al. | 438/34 |
| 5,578,998 A | 11/1996 | Kasprowicz | 340/642 |
| 5,766,987 A | 6/1998 | Mitchell et al. | 438/126 |
| 5,924,785 A | 7/1999 | Zhang et al. | 362/241 |
| 6,149,283 A | 11/2000 | Conway et al. | 362/236 |
| 6,153,448 A | 11/2000 | Takahashi | 438/114 |
| 6,224,216 B1 | 5/2001 | Parker et al. | 353/31 |
| 6,350,041 B1 | 2/2002 | Tarsa et al. | 362/231 |
| 6,422,716 B2 | 7/2002 | Henrici et al. | 362/235 |
| 6,452,217 B1 | 9/2002 | Wojnarowski et al. | 257/99 |
| 6,498,355 B1 | 12/2002 | Harrah et al. | 257/99 |
| 6,501,084 B1 | 12/2002 | Sakai et al. | 250/504 R |
| 6,577,073 B2 | 6/2003 | Shimizu et al. | |
| 6,617,795 B2 | 9/2003 | Bruning | 315/151 |
| 6,637,921 B2 | 10/2003 | Coushaine | 362/517 |
| 6,653,765 B1 | 11/2003 | Levinson | |
| 6,661,029 B1 | 12/2003 | Duggal | 257/89 |
| 6,672,741 B1 | 1/2004 | Young | 362/311 |

(Continued)

FOREIGN PATENT DOCUMENTS

| CN | 1470072 | 1/2004 |
|---|---|---|
| CN | 1470072 A | 1/2004 |

(Continued)

OTHER PUBLICATIONS

Cree EZ700 EZBright LED chip data sheet, 2006, pp. 1-6.

(Continued)

*Primary Examiner* — Evan Dzierzynski
(74) *Attorney, Agent, or Firm* — Koppel, Patrick, Heybl & Philpott

(57) ABSTRACT

Solid state luminaires and light engines comprising a first group of solid state emitters comprising a first emitter emitting above the black body locus (BBL) in a CIE diagram, and a second emitter emitting below the BBL. The combination of light from the first and second emitters generates an emission color point within a standard deviation of the BBL. A second group of solid state emitters is included, the combination of light from the first and second groups of emitters causes emission within a standard deviation of the black body locus (BBL), wherein varying the intensity of the second group of emitters causes emission from the first and second groups of emitters to vary within a range of color temperatures while still emitting within the standard deviation of the BBL.

61 Claims, 12 Drawing Sheets

(56) References Cited

U.S. PATENT DOCUMENTS

| | | | |
|---|---|---|---|
| 6,722,777 B2 | 4/2004 | Erber | 362/518 |
| 6,739,735 B2 | 5/2004 | Talamo et al. | 362/237 |
| 6,767,112 B2 | 7/2004 | Wu | 362/247 |
| 6,803,732 B2 | 10/2004 | Kraus et al. | 315/307 |
| 6,811,277 B2 | 11/2004 | Amano | 362/31 |
| 6,846,101 B2 | 1/2005 | Coushaine | 362/517 |
| 6,891,200 B2 | 5/2005 | Nagai et al. | 257/88 |
| 6,893,140 B2 | 5/2005 | Storey et al. | 362/191 |
| 6,899,443 B2 | 5/2005 | Rizkin et al. | 362/327 |
| 6,909,123 B2 | 6/2005 | Hayashimoto et al. | 257/98 |
| 6,948,825 B2 | 9/2005 | Christoph | 362/33 |
| 7,001,047 B2 | 2/2006 | Holder et al. | 362/296 |
| 7,002,546 B1 | 2/2006 | Stuppi et al. | 345/102 |
| 7,008,080 B2 | 3/2006 | Bachl et al. | 362/237 |
| 7,023,019 B2 | 4/2006 | Maeda et al. | 257/89 |
| 7,029,150 B2 | 4/2006 | Finch | 362/298 |
| 7,055,987 B2 | 6/2006 | Staufert | 362/235 |
| 7,095,053 B2 | 8/2006 | Mazzochette et al. | 257/81 |
| 7,097,334 B2 | 8/2006 | Ishida et al. | 362/516 |
| 7,121,691 B2 | 10/2006 | Coushine et al. | 362/298 |
| 7,131,760 B2 | 11/2006 | Mayer et al. | 362/555 |
| 7,178,937 B2 | 2/2007 | McDermott | 362/187 |
| 7,204,607 B2 | 4/2007 | Yano et al. | 362/231 |
| 7,213,940 B1 | 5/2007 | Van de Ven et al. | |
| 7,230,280 B2 | 6/2007 | Yaw et al. | 257/98 |
| 7,246,921 B2 | 7/2007 | Jacobson et al. | 362/294 |
| 7,259,400 B1 | 8/2007 | Taskar | 257/98 |
| 7,270,448 B1 | 9/2007 | Maley, Sr. | 362/334 |
| 7,278,755 B2 | 10/2007 | Inamoto | 362/240 |
| 7,286,296 B2 | 10/2007 | Chaves et al. | 359/641 |
| 7,355,562 B2 | 4/2008 | Schubert et al. | 345/1.3 |
| 7,381,995 B2 | 6/2008 | Tain et al. | |
| 7,605,452 B2 | 10/2009 | Yamanaka et al. | 257/676 |
| 7,621,655 B2 | 11/2009 | Roberts et al. | 362/249.02 |
| 7,665,861 B2 | 2/2010 | Blumel et al. | 362/249.02 |
| 7,723,744 B2 | 5/2010 | Gillies et al. | 257/98 |
| 7,821,023 B2 | 10/2010 | Yuan | 257/98 |
| 7,897,980 B2 | 3/2011 | Yuan et al. | 257/88 |
| 7,902,560 B2 | 3/2011 | Bierhuizen et al. | 257/82 |
| 8,022,626 B2 | 9/2011 | Hamby et al. | 313/512 |
| 8,183,585 B2 | 5/2012 | Scotch et al. | 257/97 |
| 8,188,486 B2 | 5/2012 | Lapatovich et al. | 257/79 |
| 8,272,757 B1 | 9/2012 | Fan et al. | 362/231 |
| 8,385,735 B2 | 2/2013 | Awazu | 396/236 |
| 2002/0001193 A1 | 1/2002 | Osawa | |
| 2002/0001869 A1 | 1/2002 | Fjelstad | |
| 2002/0029071 A1 | 3/2002 | Whitehurst | 607/88 |
| 2002/0070681 A1 | 6/2002 | Shimizu et al. | 315/246 |
| 2002/0093820 A1 | 7/2002 | Pederson | |
| 2002/0113246 A1 | 8/2002 | Nagal et al. | |
| 2002/0136025 A1 | 9/2002 | Zhang | |
| 2002/0153529 A1 | 10/2002 | Shie | 257/99 |
| 2002/0171089 A1 | 11/2002 | Okuyama et al. | 257/88 |
| 2002/0171090 A1 | 11/2002 | Oohata et al. | 257/88 |
| 2003/0053310 A1 | 3/2003 | Sommers et al. | |
| 2003/0058641 A1 | 3/2003 | Watanabe | |
| 2003/0063475 A1 | 4/2003 | Simmons | |
| 2003/0072153 A1 | 4/2003 | Matsui et al. | |
| 2003/0116769 A1 | 6/2003 | Song et al. | |
| 2003/0147055 A1 | 8/2003 | Yokoyama | |
| 2003/0189829 A1 | 10/2003 | Shimizu et al. | 362/240 |
| 2004/0104391 A1 | 6/2004 | Maeda et al. | 257/79 |
| 2004/0155565 A1 | 8/2004 | Holder et al. | |
| 2004/0184272 A1 | 9/2004 | Wright et al. | 362/373 |
| 2004/0239242 A1 | 12/2004 | Mano et al. | |
| 2004/0245532 A1 | 12/2004 | Maeda et al. | 257/89 |
| 2004/0256626 A1 | 12/2004 | Wang | |
| 2005/0024868 A1 | 2/2005 | Nagai | |
| 2005/0057929 A1 | 3/2005 | Yano et al. | 362/240 |
| 2005/0073840 A1 | 4/2005 | Chou et al. | |
| 2005/0093422 A1 | 5/2005 | Wang | |
| 2005/0122018 A1 | 6/2005 | Morris | 313/46 |
| 2005/0122031 A1 | 6/2005 | Itai et al. | |
| 2005/0253151 A1 | 11/2005 | Sakai et al. | 257/79 |
| 2006/0043406 A1 | 3/2006 | Tsubokura et al. | 257/99 |
| 2006/0105478 A1 | 5/2006 | Camras et al. | 438/22 |
| 2006/0105484 A1 | 5/2006 | Basin | |
| 2006/0157721 A1 | 7/2006 | Tran et al. | |
| 2006/0163589 A1 | 7/2006 | Fan et al. | 257/88 |
| 2006/0180818 A1 | 8/2006 | Nagai et al. | |
| 2006/0231852 A1 | 10/2006 | Kususe et al. | 257/99 |
| 2006/0258028 A1 | 11/2006 | Paolini | |
| 2006/0262524 A1 | 11/2006 | Kah, Jr. | |
| 2006/0289878 A1 | 12/2006 | Brunner et al. | 257/89 |
| 2007/0013057 A1 | 1/2007 | Mazzochette | |
| 2007/0030676 A1 | 2/2007 | Ichihara | |
| 2007/0046176 A1 | 3/2007 | Bukesov et al. | 313/496 |
| 2007/0109779 A1 | 5/2007 | Sekiguchi et al. | |
| 2007/0115670 A1 | 5/2007 | Roberts et al. | |
| 2007/0139920 A1 | 6/2007 | Van De Ven et al. | 362/235 |
| 2007/0158668 A1 | 7/2007 | Tarsa | 257/79 |
| 2007/0189017 A1 | 8/2007 | Hofmann | |
| 2007/0223219 A1 | 9/2007 | Medendorp, Jr. et al. | |
| 2007/0252924 A1 | 11/2007 | Haga et al. | 349/68 |
| 2007/0267983 A1 | 11/2007 | Van De Ven et al. | |
| 2007/0278503 A1 | 12/2007 | Van De Ven et al. | |
| 2007/0278934 A1 | 12/2007 | Van De Ven et al. | |
| 2007/0279903 A1 | 12/2007 | Negley et al. | |
| 2007/0291467 A1* | 12/2007 | Nagai et al. | 362/84 |
| 2007/0295972 A1 | 12/2007 | Tsai et al. | 257/88 |
| 2008/0024696 A1 | 1/2008 | Arai et al. | 349/62 |
| 2008/0074029 A1 | 3/2008 | Suehiro | |
| 2008/0074885 A1 | 3/2008 | Brands et al. | |
| 2008/0084685 A1 | 4/2008 | Van De Ven et al. | |
| 2008/0084701 A1 | 4/2008 | Van De Ven et al. | |
| 2008/0100774 A1 | 5/2008 | Jeon et al. | 349/62 |
| 2008/0106895 A1 | 5/2008 | Van De Ven et al. | |
| 2008/0106907 A1 | 5/2008 | Trott et al. | |
| 2008/0112164 A1 | 5/2008 | Teshirogi | 362/231 |
| 2008/0112168 A1 | 5/2008 | Pickard et al. | |
| 2008/0128735 A1 | 6/2008 | Yoo | |
| 2008/0130285 A1 | 6/2008 | Negley | 362/231 |
| 2008/0137357 A1 | 6/2008 | Friedrichs et al. | 362/507 |
| 2008/0142816 A1 | 6/2008 | Bierhuizen et al. | 257/82 |
| 2008/0151527 A1 | 6/2008 | Ueno | |
| 2008/0170396 A1 | 7/2008 | Yuan et al. | 362/244 |
| 2008/0173884 A1 | 7/2008 | Chitnis | 438/22 |
| 2008/0179611 A1 | 7/2008 | Chitnis | 257/98 |
| 2008/0186702 A1 | 8/2008 | Camras et al. | 362/231 |
| 2008/0203415 A1 | 8/2008 | Thompson et al. | |
| 2008/0204366 A1 | 8/2008 | Kane et al. | 345/44 |
| 2008/0232079 A1 | 9/2008 | Awazu | 362/3 |
| 2008/0238335 A1 | 10/2008 | Lee | |
| 2008/0285268 A1 | 11/2008 | Oku et al. | 362/231 |
| 2009/0008662 A1 | 1/2009 | Ashdown et al. | |
| 2009/0050907 A1 | 2/2009 | Yuan et al. | 257/88 |
| 2009/0050908 A1 | 2/2009 | Yuan et al. | 257/88 |
| 2009/0108281 A1 | 4/2009 | Keller et al. | 257/98 |
| 2009/0160363 A1 | 6/2009 | Negley | |
| 2009/0231832 A1* | 9/2009 | Zukauskas et al. | 362/84 |
| 2009/0257240 A1* | 10/2009 | Koike | 362/538 |
| 2010/0079059 A1 | 4/2010 | Roberts | 362/231 |
| 2010/0103660 A1 | 4/2010 | Van De Ven | 362/231 |

FOREIGN PATENT DOCUMENTS

| | | |
|---|---|---|
| CN | 1983590 A | 6/2007 |
| EP | 2 056 363 | 5/2009 |
| JP | 03209781 | 9/1991 |
| JP | 09246602 | 9/1997 |
| JP | 10012915 | 1/1998 |
| JP | 2001057446 | 2/2001 |
| JP | 2002184207 | 6/2002 |
| JP | 2002184207 A | 6/2002 |
| JP | 2003-168305 | 6/2003 |
| JP | 2003168305 | 6/2003 |
| JP | 2003168305 A | 6/2003 |
| JP | 2004512687 | 4/2004 |
| JP | 2005-228695 | 8/2005 |
| JP | 2005228695 A | 8/2005 |
| JP | 2006054329 A | 2/2006 |
| JP | 2006-128512 | 5/2006 |
| JP | 2006128512 | 5/2006 |
| JP | 2006173271 | 6/2006 |
| JP | 2006261375 | 9/2006 |

| | | |
|---|---|---|
| JP | 200759260 | 3/2007 |
| JP | 2007189239 | 7/2007 |
| JP | 2007519221 | 7/2007 |
| JP | 20075149221 | 7/2007 |
| JP | 2007251214 | 9/2007 |
| JP | 2007529105 | 10/2007 |
| JP | 2010511978 | 4/2010 |
| WO | 02097884 A1 | 12/2002 |
| WO | WO 02/097884 | 12/2002 |
| WO | WO 2005013365 A2 | 2/2005 |
| WO | WO 2006/001221 A1 | 1/2006 |
| WO | 2006068297 A1 | 6/2006 |
| WO | WO2006/068297 | 6/2006 |
| WO | WO 2006068297 | 6/2006 |
| WO | 2006135005 | 12/2006 |
| WO | WO 2007121486 A2 | 10/2007 |
| WO | WO 2007126720 A2 | 11/2007 |
| WO | WO 2007/138695 | 12/2007 |
| WO | WO 2008/003176 | 1/2008 |
| WO | WO 2009/157999 A1 | 12/2009 |

OTHER PUBLICATIONS

Cree EZ1000 EZBright LED chip data sheet, 2006, pp. 1-6.
Cree XLamp XR-E and XR-C LED data sheet, 2007, pp. 1-11.
Lamina, Titan Turbo LED Light Engines data sheet, 2008.
U.S. Appl. No. 61/041,404, "Solid State Lighting Devices and Methods of Manufacturing Same".
U.S. Appl. No. 60/130,411, "Light Source With Near Field Mixing".
U.S. Appl. No. 61/037,365.
Office Action from U.S. Appl. No. 12/156,995, dated: Mar. 10, 2010.
Response to Office Action from U.S. Appl. No. 12/156,995, filed: Sep. 10, 2010.
Office Action from U.S. Appl. No. 12/288,957, dated: Sep. 21, 2010.
Response to Office Action from U.S. Appl. No. 12/288,957, filed: Dec. 21, 2010.
Office Action from U.S. Appl. No. 12/629,735, dated: Sep. 22, 2010.
Response to Office Action from U.S. Appl. No. 12/629,735, filed: Dec. 22, 2010.
Response to Office Action from U.S. Appl. No. 12/156,995, filed: Apr. 18, 2011.
Office Action from U.S. Appl. No. 12/288,957, dated: Mar. 9, 2011.
Office Action from U.S. Appl. No. 12/629,735, dated:Mar. 10, 2011.
Office Action for U.S. Appl. No. 12/883,979, mailed Sep. 12, 2011.
Response to Office Action Sep. 12, 2011, U.S. Appl. No. 12/883,979, filed Feb. 7, 2012.
Notice of Allowance from U.S. Appl. No. 12/883,979, mailed Mar. 19, 2012.
Office Action for U.S. Appl. No. 12/156,995, mailed on Aug. 30, 2011.
Response to Office Action mailed Aug. 30, 2011, U.S. Appl. No. 12/156,995, filed Nov. 29, 2011.
Office Action for U.S. Appl. No. 12/288,957, mailed Oct. 18, 2011.
Response to Office Action mailed Oct. 18, 2011, U.S. Appl. No. 12/288,957, filed Dec. 19, 2011.
Advisory Action for U.S. Appl. No. 12/288,957, mailed Jan. 11, 2012.
Response to Advisory Action U.S. Appl. No. 12/288,957, filed Feb. 15, 2012.
Office Action for U.S. Appl. No. 11/982,276, mailed Feb. 22, 2012.
International Search Report and Written Opinion for PCT/US2010/003168 mailed Apr. 26, 2011.
Summary of Reasons for Rejection for Japanese Patent Application No. 2007-228699 mailed May 10, 2011.
Notice of Reasons for Rejection from Japanese Patent Application No. 2008-221738, dated: Aug. 3, 2011.
International Search Report and Written Opinion from counterpart PCT Application No. PCT/US2010/003190 mailed Apr. 6, 2011.
U.S. Appl. No. 11/656,759, filed Jan. 22, 2007, "Wafer Level Phosphor Coating Method and Devices Fabricated Utilizing Method".
U.S. Appl. No. 11/899,790, filed Sep. 7, 2007, "Wafer Level Phosphor Coating Method and Devices Fabricated Utilizing Method".
U.S. Appl. No. 11/473,089, filed Jun. 21, 2006, "Close Loop Electrophoretic Deposition of Semiconductor Devices".
EPO Communication Pursuant to Rule 161(1) and 162 EPC for European Patent Application No. 09750906.1 dated Feb. 1, 2011.
International Search Report and Written Opinion for PCT/US2009/001628 dated Dec. 3, 2009.
EPO Communication Pursuant to Rule 161(1) and 162 EPC for European Patent Application No. 09758647.3 dated Jan. 24, 2011.
International Search Report and Written Opinion for PCT/US2009/002155 dated Aug. 6, 2009.
Office Action from U.S. Appl. No. 12/156,995, dated: Nov. 17, 2010.
Reason for Rejection for Japanese Patent Application No. 2011-510484, dated Aug. 7, 2012.
International Search Report and Written Opinion from PCT/US2011/001200. dated Apr. 27, 2012.
First Office Action for Chinese Patent Application No. 201230001815.3. dated Apr. 11, 2012.
Summary of Notice of Reasons for Rejection from Japanese Patent Application No. 2007-228699, dated May 8, 2012.
Notice of Reasons for Rejection from Japanese Patent Application No. 2008-221738, dated May 29, 2012.
First Office Action for Chinese Patent Application No. 200980125244.X, dated May 28, 2012.
Notice of Reasons for Rejection in Japanese Patent Application No. 2011-512442. dated Aug. 7, 2012.
First Office Action from Chinese Patent Application 200980142352.8. dated Aug. 27, 2012 (received Nov. 2, 2012).
Search Report from Chinese Patent Application No. 200980125244.X, dated Nov. 5, 2012.
Second Office Action from Chinese Patent Application No. 200980125244.X, dated Nov. 26, 2012.
First Office Action from Chinese Patent Application No. 200980142352.8, dated Aug. 27, 2012.
PCT Preliminary Report and Written Opinion from PCT Appl. No. PCT/US2011/001200, dated Jan. 17, 2013.
Office Action from U.S. Appl. No. 12/156,995, dated: Apr. 12, 2012.
Response to Office Action from U.S. Appl. No. 12/156,995, filed Sep. 12, 2012.
Office Action from U.S. Appl. No. 11/982,276, dated Aug. 7, 2012.
Response to Office Action from U.S. Appl. No. 11/982,276, filed Sep. 25, 2012.
Office Action from U.S. Appl. No. 11/982,276, dated: Oct. 10, 2012.
Response to Office Action from U.S. Appl. No. 11/982,276, filed Nov. 2, 2012.
Office Action from U.S. Appl. No. 12/643,670, dated: Oct. 1, 2012.
Response to Office Action from U.S. Appl. No. 12/643,670, filed Dec. 21, 2012.
Office Action from U.S. Appl. No. 13/177,415, dated: Jan. 25, 2013.
Office Action from U.S. Appl. No. 12/629,735, dated: Feb. 8, 2013.
Office Action from U.S. Appl. No. 13/489,035, dated: Jan. 12, 2013.
Office Action from U.S. Appl. No. 12/288,957, dated: Mar. 26,2013.
Office Action from U.S. Appl. No. 12/862,640, dated: Apr. 30, 2013.
Office Action from U.S. Appl. No. 13/177,415, dated: May 2, 2013.
Notice of Reasons for Rejection from Japanese Patent Appl. No. 2011-533175, dated Apr. 2, 2013.
Decision of Rejection from Japanese Patent Application No. 2008-221738, dated Feb. 26, 2013.
Decision of Dismissal of Amendment from Japanese Patent Application No. 2008-221738, dated Feb. 26, 2013.
Office Action from Japanese Patent Application No. 2011-512442, dated Feb. 22, 2013.
Office Action from Japanese Patent Appl. No. 2007-228699, dated Mar. 6, 2013.

* cited by examiner

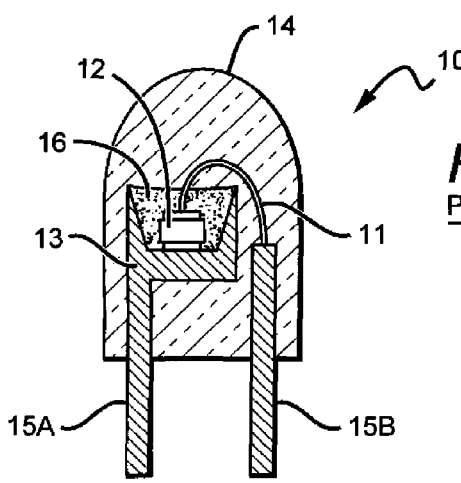
*FIG. 1*
PRIOR ART
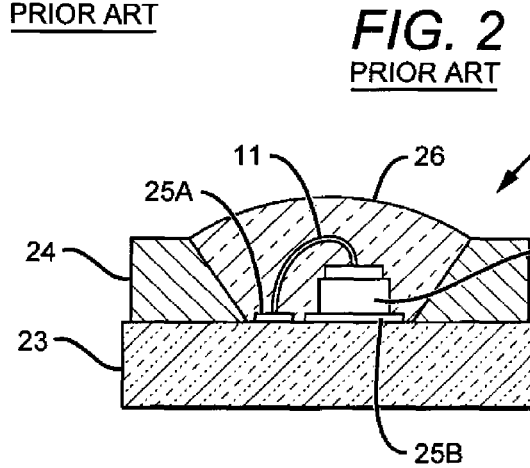
*FIG. 2*
PRIOR ART
*FIG. 3*
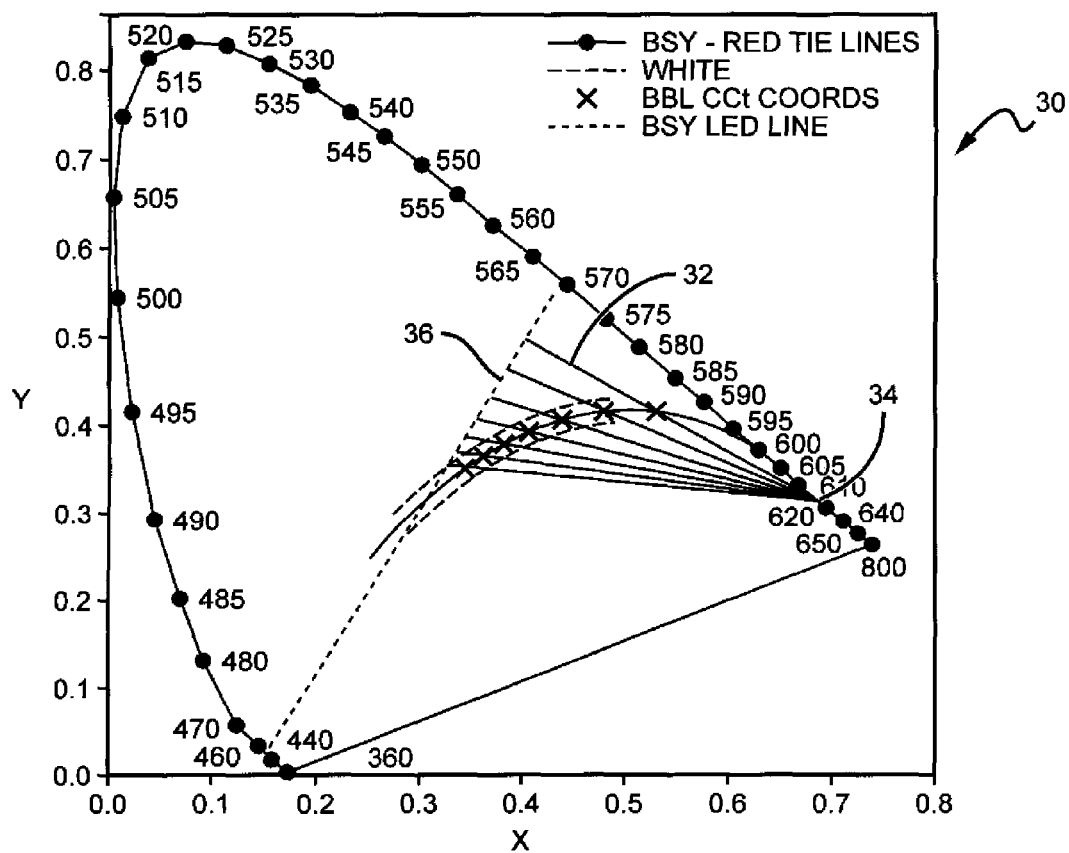

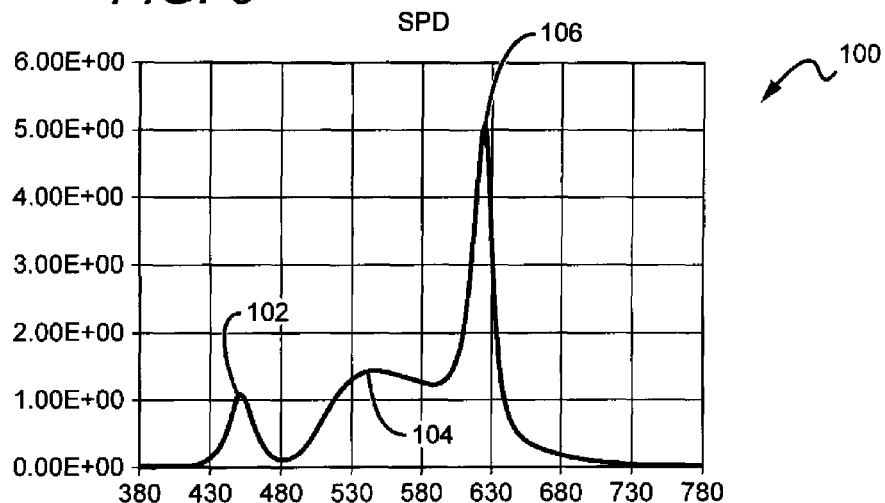
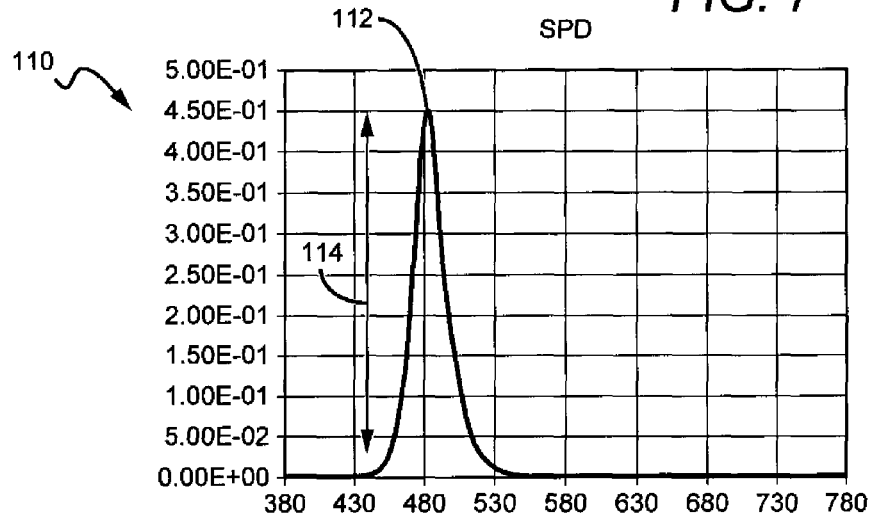
FIG. 9
| VARIABLE CCT RANGE | | ADDED BLUE LIGHT | | | | Δu¹v¹ | CRI Ra |
|---|---|---|---|---|---|---|---|
| | | DOMINANT WAVELENGTH (nm) | | | MAX. % OF TOTAL LUMENS | | |
| LOWER | HIGHER | MIN. | OPTIMUM | MAX. | | MAX. | MIN. |
| 2725 | 4000 | 484 | 488 | 491 | 15% | 0.009 | 72 |
| 2725 | 5000 | 484 | 487 | 491 | 25% | 0.009 | 60 |
| 2725 | 6500 | 484 | 485 | 487 | 27% | 0.009 | 49 |

| CCT | 6500K | 5700K | 5000K | 4500K | 4000K | 3500K | 3000K | 2700K |
|---|---|---|---|---|---|---|---|---|
| X | 0.3122 | 0.3286 | 0.3445 | 0.3612 | 0.3812 | 0.4058 | 0.4316 | 0.4578 |
| Y | 0.3433 | 0.3509 | 0.3582 | 0.3658 | 0.3750 | 0.3862 | 0.3981 | 0.4101 |
| CCTn | 6430 | 5664 | 5043 | 4500 | 3965 | 3453 | 3042 | 2725 |
| CRI Ra | 91.0 | 90.7 | 90.3 | 90.1 | 90.3 | 91.4 | 92.8 | 92.7 |
| Lumens | 165.1 | 152.1 | 141.7 | 132.6 | 123.4 | 114.3 | 106.5 | 100.0 |
| Δ u'v' Target | 0.009667 | 0.005742 | 0.001807 | 0.000061 | 0.002632 | 0.002817 | 0.002386 | 0.000002 |
| LEP | 320 | 325 | 329 | 333 | 338 | 344 | 350 | 356 |
| % BG Lumens | 39% | 34% | 29% | 25% | 19% | 13% | 6% | 0% |
| G:B Lumens | 7.45 | 7.45 | 7.45 | 7.45 | 7.45 | 7.45 | 7.45 | 7.45 |

US 8,511,851 B2

HIGH CRI ADJUSTABLE COLOR TEMPERATURE LIGHTING DEVICES

BACKGROUND OF THE INVENTION

1. Field of the Invention

This invention relates to solid state lighting (SSL) and in particular to SSL luminaires having a plurality of LED chips or LED packages whose emission combines to produce light with the desired characteristics.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup due to the less than 100% reflectivity of practical reflector surfaces). In addition, heat retention may be an issue for a package such as the package 10 shown in FIG. 1, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LEDs and LED packages, such as those shown in FIGS. 1 and 2, are more commonly being used for lighting applications that were previously the domain of incandescent or fluorescent lighting. The LEDs and LED packages can be arranged as the light source in SSL luminaires or lamps and single or multiple LEDs or LED packages can be used. The general acceptance of these luminaries has accelerated with the improvement in LED emission efficiency and quality. LEDs have been demonstrated that can produce white light with an efficiency of greater than 150 L/W, and LEDs are expected to be the predominant commercially utilized lighting devices within the next decade.

The light generated by different light sources can be measured in terms of color rendering index (CRI or CRI Ra) and color temperature. CRI is a quantitative measurement of the ability of a light source to reproduce the colors of various objects faithfully in comparison with an ideal or natural light source. Light sources with a high CRI approaching 100 can be desirable in color-critical applications such as photography and cinematography. Daylight has a high CRI of approximately 100 and incandescent bulbs have a relatively close CRI of greater than 95. By comparison, fluorescent lighting has a lower CRI in the range of 70-80, and mercury vapor or sodium lamps have a much lower CRI of 40 or less. High quality light suitable for general indoor illumination should have a CRI of greater than 90.

Color temperature is a characteristic of light source that is determined by comparing the light's chromaticity with that of an ideal black-body radiator. The temperature (usually measured in kelvins (K)) at which the heated black-body radiator matches the color produced by the light source is that source's color temperature. For incandescent light sources the light is of thermal origin and is very close to that of an ideal black-body radiator. Higher color temperatures of 5000 K or more are "cool" and have green to blue colors while lower color temperatures of 2700 to 3500 K are considered "warm" and have yellow to red colors. General illumination can have a color temperature between 2,000 and 10,000 K, with the majority of general lighting devices being between 2,700 and 6,500 K.

In contrast to incandescent radiation, light sources, such as fluorescent lamps emit light primarily by processes other than raising the temperature of a body. This means the emitted radiation does not follow the form of a black-body spectrum and these sources are assigned what is known as a correlated color temperature (CCT). COT is the color temperature of a black body radiator which to human color perception most closely matches the light from the lamp. For high quality light sources it is also important that color of the illumination be as close as possible to that of a black body spectrum (i.e. black body locus on CIE chromaticity diagram). One such standard deviation is measured in terms of a MacAdam ellipse with a suitable proximity to the black body locus typically being within a 4-step MacAdam ellipse.

SSL luminaires have been developed that utilize a plurality of LED chips or LED packages, with at least some being coated by a conversion material so that the combination of all the LED chips or packages produces the desired wavelength of white light. Some of these include blue emitting LEDs covered by a conversion material such as YAG:CE or Bose, and blue or UV LEDs covered by RGB phosphors. These have resulted in luminaires with generally good efficacy, but only medium CRI. These luminaires typically have not been able to demonstrate both the desirable high CRI and high efficacy, especially with color temperatures between 2700K and 4000K.

Techniques for generating white light from a plurality of discrete light sources to provide improved CRT at the desired color temperature have been developed that utilize different hues from different discrete light sources. Such techniques are described in U.S. Pat. No. 7,213,940, entitled "Lighting Device and Lighting Method". In one such arrangement a 452 nm peak blue InGaN LEDs were coated with a yellow conversion material, such as a YAG:Ce phosphor, to provide a color that was distinctly yellow and has a color point that fell well above the black body locus on the CIE diagram. Blue emitting LEDs coated by yellow conversion materials are often referred to as blue shifted yellow (BSY) LEDs or LED chips. The BSY emission is combined with the light from reddish AlInGaP LEDs that "pulls" the yellow color of the yellow LEDs to the black body curve to produce warm white light. FIG. 3 shows a CIE diagram 30 with the tie lines 32 between red light 34 from red emitting LEDs and various yellow and yellowish points from different BSY emitters. With this approach, high efficacy warm white light with improved CRI can be generated. Some embodiments exhibited improved efficacy, with CRI Ra of greater than 90 at color temperatures below 3500 K.

SUMMARY OF THE INVENTION

The present invention is directed tp SSL luminaires having light engines arranged to allow for characteristics of the luminaire emission to vary in a desired way by varying the emission of a group of emitters in the light engine. In some embodiments, the color temperature of the luminaires can be varied within a certain range while keeping the emission within a standard deviation of the black body locus in a CIE diagram.

One embodiment of an SSL luminaire according to the present invention comprises a control group of solid state emitters and a variable group of solid state emitters. The combination of light from the control and variable groups of emitters causes emission within a standard deviation of the black body locus (BBL). Further, varying of the emission intensity of the variable group of emitters causes combined emission of the control and variable emitters to vary within a range of temperatures while still emitting within the standard deviation of the BBL.

Another embodiment of an SSL luminaire according to the present invention comprises a control group of solid state emitters having a first emitter emitting light at a color point above the BBL in a CIE graph and a second emitter emitting light at a color point below the BBL. A variable group of emitters is included whose emission intensity can be varied to vary the combined emission of the control and variable emitters along a range of color temperatures while maintaining the emission within a standard deviation of a BBL.

One embodiment of a light engine according to the present invention comprises a first group of solid state emitters comprising a first emitter emitting above the BBL in a CIE diagram, and a second emitter emitting below the BBL. The combination of light from the first and second emitters generates an emission color point within a standard deviation of the BBL. A second group of solid state emitters is included, the combination of light from the first and second groups of emitters causes emission within a standard deviation of the BBL, wherein varying the intensity of the second group of emitters causes emission from the first and second groups of emitters to vary within a range of color temperatures while still emitting within the standard deviation of the BBL.

One embodiment of a method for varying the emission from a luminaire according to the present invention, comprises providing emission from a first source at a first color point within a standard deviation of the black body locus (BBL) on a CIE graph. Emission from a second source is provided whose emission intensity is variable to vary the emission of the luminaire along a range of emissions all of which are within a standard deviation of the black body locus.

Still another embodiment of a light engine according to the present invention can comprise a blue shifted green (BSG) LED chip comprising a blue LED coated by a green phosphor. The green phosphor is arranged to absorb at least some of the blue light emitting from the blue LED and emit a green light. A red emitting LED chip is included and the combination of light from the BSG LED chip and red LED chip generates a light with a color point within a standard deviation of the BBL of a CIE diagram.

These and other aspects and advantages of the invention will become apparent from the following detailed description and the accompanying drawings which illustrate by way of example the features of the invention.

BRIEF DESCRIPTION OF THE DRAWINGS

FIG. 1 shows a sectional view of one embodiment of a prior art LED lamp;

FIG. 2 shows a sectional view of another embodiment of a prior art LED lamp;

FIG. 3 is a CIE diagram showing the tie lines between BSY and red emitters;

FIG. 6 is a graph showing the emission characteristics for one embodiment of a control group of LED chips according to the present invention;

FIG. 7 is a graph showing the emission characteristics for one embodiment of a variable group of LED chips according to the present invention;

FIG. 9 is table showing emission characteristics for three embodiments of light engines according to the present invention;

DETAILED DESCRIPTION OF THE INVENTION

Figure 4:
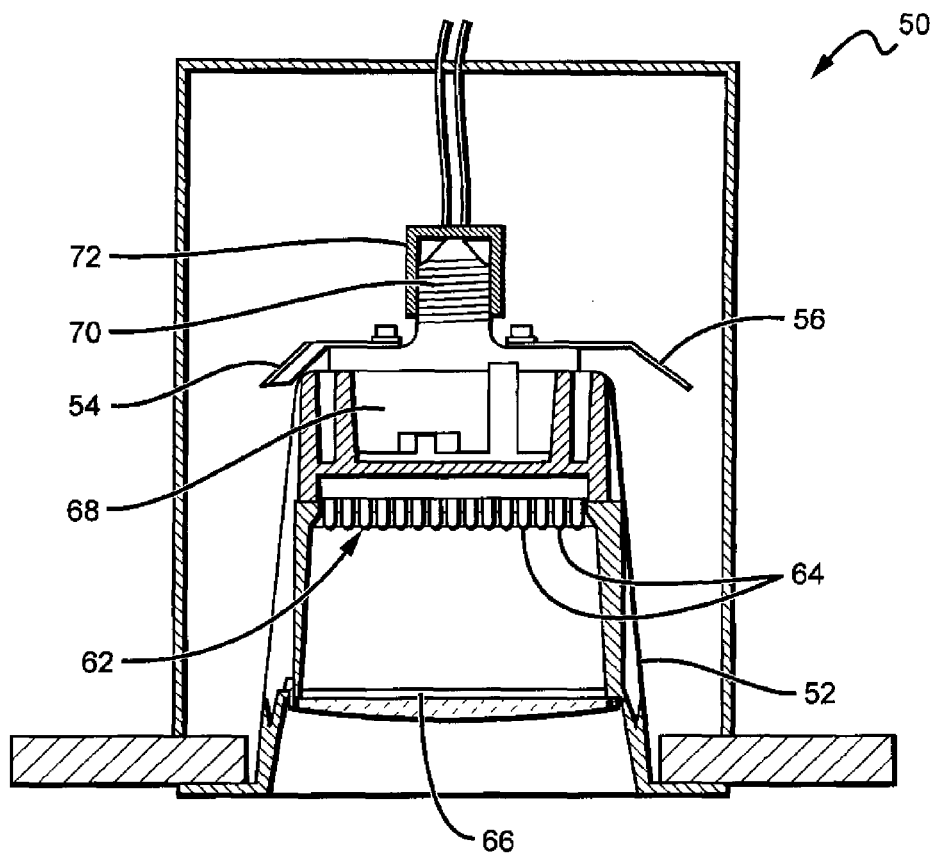
FIG. 4 is a side view of one embodiment of an SSL luminaire according to the present invention.

The present invention is directed to SSL lamps or luminaires (SSL luminaires) that combine the emission of multiple emitter types to obtain the desired luminaire emission characteristics. The present invention is particularly directed to SSL luminaires having multiple different types of LED chips in an LED chip array with some of the LED chips emitting at different wavelengths of light. The emission of some of the LED chips can be held constant while the emission of other LEDs can be varied to vary the color temperature of the SSL luminaire emission over a range. In another aspect of the present invention, the emission is kept within an acceptable deviation of the BBL on a CIE diagram through this range of color temperatures.

In some embodiments the ratio of light emitted by different types of LEDs chips in a control group of LEDs chips remains constant, and the light from a variable LED or group of LEDs is varied to provide the desired change in emission characteristics for the SSL luminaire. That is, the emission of the variable group of LED chips can be varied to change the color temperature for the SSL luminaire emission over a particular range of temperature while remaining within the standard deviation.

In other embodiments of the present invention the control group of LED chips can comprise first and second emitter types that emit first and second colors of light whose emission intensities are held in constant ratio to one another. The variable LED chips or groups of LED chips can comprise a third LED type emitting a third color that can be varied in to obtain the desired change in emission characteristics, such as change in color temperature. In these embodiments the ratio of emission of the first emitter can remain constant compared to the second emitters, but the ratio of emission for the first and second compared to that of the third emitter can be varied to vary the SSL luminaire emission.

In other embodiments the control group of LED chips can also comprise first and second emitter types whose emission ratios are held constant. The variable group of LED chips can comprise third and fourth LED chips emitting third and fourth colors that can be held in constant emission ratio between the two. To obtain different emission characteristics for different SSL luminaires, the ratio of light from the variable group of LED chipss is varied compared to that of the control group of LED chips. That is, the intensity of the variable group of LED chips is varied compared to the control group. In some embodiments, ratio of emission between the different types of LED chips can be maintained in each respective group while the emission intensity of the variable group of LED chips is varied. It is understood that the control group of LED chips can comprise more than two LED chips and the variable group of LED chips can comprise more than two LED chips, with some embodiments having the emission ratio within each of the groups remaining constant and the emission ratio between the different groups varying. In still other embodiments, the emission intensity ratio within the variable or control group of LED chips can be varied to provide the desired emission for the luminaire. For example, in some embodiments the emission intensity of different LED chips within the variable group of LED chips can also be varied.

The embodiments below are discussed in relation to varying the color temperature of the SSL luminaires by varying the emission of at least one of the LED chip groups. It is understood, however, that in other embodiments the emission characteristics can be varied within the LED groups. It is also understood that different types of LED chips emitting at different wavelengths can provide for different levels or ranges of control while still keeping desired CRI and still keeping emission within standard deviations of the BBL.

It is understood that the variable and control groups of LED chips can comprise many different LED chips emitting light at many different wavelengths. In one embodiment, the control LED chips can comprise BSY LED chips and red emitting LED chips that are held in constant emission ratio between the two. The variable LED chips can comprise one or more blue emitting LED chips that provide a variable amount of blue light depending on the desired SSL luminaire characteristics. As described below, as more blue light can be added to increase the CCT while maintaining the emission with the standard deviation of the BBL. In another embodiment, control group of LED chips can comprise BSY and red chips kept in generally constant emission ratio between the two. The variable group of LEDs can comprise blue and green LED chips that also can be kept in emission ratio between the two. The CCT of the SSL luminaire emission can be varied by varying the overall emission of the variable group of LED chips compared to that of the control group of LED chips.

In other embodiments, the control and variable group of LED chips can comprise other LED chip types emitting at different colors or wavelengths of light. Other SSL luminaire embodiments according to the present invention can comprise blue emitting LEDs coated with a green conversion material (BSG LED chips) with all or most of the blue light from the LEDs being converted by the green conversion material. The BSG LED chips provide a light that is greenish and has a color point above the BBL on the CIE diagram. The BSG emission is combined with the light from red or reddish LED chips that pulls the green color of the BSG LED chips to the BBL to produce warm white light with the desired temperature. The light can fall within a standard deviation of the BBL at the desired temperature.

In different embodiments where it is desirable to vary the temperature of variable light as discussed above, the BSG and red LED chips can comprise the control or variable groups of LED chips as described above. As the control LED chips, the emission of BSG and red LED chips can be held constant while the emission of a variable group of other LED chips can be varied to vary the color temperature of the SSL luminaire emission over a range. According to one aspect of the invention, the emission of the luminaire is kept within an acceptable deviation of the BBL on a CIE diagram through this range of color temperatures. In other embodiments, the BSG and red LED chips can also comprise the variable group of LED chips whose emission can be varied and combined with the emission from a control group of LED chips to vary the emission color temperature over a range while keeping the emission within a standard deviation of the BBL.

The present invention is described herein with reference to certain embodiments, but it is understood that the invention can be embodied in many different forms and should not be construed as limited to the embodiments set forth herein. In particular, the present invention is described below in regards to certain SSL luminaires having arrays of LED chips in different configurations. These are generally referred to as SSL luminaires, but it is understood that the present invention can be used for many other lamps or lighting applications having many different array configurations of different emitter types. The luminaires and its components can have different shapes and sizes beyond those shown and different numbers of LED chips can be included in the arrays. Some or all of the LED chips in the arrays can be coated with a conversion material that can comprise a phosphor loaded binder ("phosphor/binder coating"), but it is understood that LEDs without a conversion material can also be used.

The luminaires according to the present invention are described as using LED chips or arrays of LED chips as their light source, but it is also understood that these can also include LEDs and LED packages. Many different arrangements of LEDs, LED chips or LED packages can be combined in the SSL luminaires according to the present invention, and hybrid or discrete solid state lighting elements can be used to provide the desired combination of lighting characteristics. For ease of description the emitters in the SSL luminaires below are described as using "LED chips", but it is understood that they can include any of the emitter types described herein.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, and/or sections, these elements, components, and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

It is understood that the arrangements described herein can be utilized in many different SSL luminaires having different features arranged in different ways. FIG. 4 shows just one embodiment of an SSL luminaire 50 according to the present invention that can comprise a plurality of LED chips arranged as its light source according to the present invention. The luminaire 50 generally comprises a housing 52 that can be mounted in place in a fixture, wall or ceiling using many different mounting mechanisms. In the embodiment shown, the mounting mechanisms comprise a first mounting clip 54, a second mounting clip 56, and a third mounting clip (not visible in FIG. 4). A light engine 62 is arranged in the housing 52 and comprises a plurality of LED chips 64 mounted so that light from the LED chips is directed out the opening of the housing 52 and the emission of the LED chips 64 combines to produce the desired emission characteristics of the luminaire 50. A diffuser 66 can be included over the housing opening, and a power supply/converter 68 is included. The housing 52 can also comprise an electrical connection region 70 which is engageable with an electricity supply device 72 (in this embodiment, an Edison socket).

The power supply/converter 68 can also be positioned within the housing and can comprise a conventional rectifier and high voltage converter. If power comprising an AC voltage is supplied to luminaire 50, the power supply/converter 68 can convert the AC power and supplies energy to the light engine 62 in a form compatible with driving LED chips 64 so that they emit light. The power converter can also be arranged to provide drive signals to different groups of the LED chips 64, with the emission of at least some of the LED chips being varied under control of the power supply/converter. These control signals can be provided using known electronic components and circuitry, and the varying of the emission of some of the LED chips can be manually or electronically controlled.

In this embodiment, the diffuser 66 can be designed to promote effective color mixing, depixelization, and high optical efficiency. The diffuser 66 can be attached to the housing 52 via mechanical snap-fit to the lower housing in such a manner that it requires the device to be uninstalled (powered down) to remove it, and/or the diffuser (lens) can be permanently attached (i.e., removal would require breakage), e.g., by heat staking, suitable heat staking techniques being well-known in the art.

Figure 5:
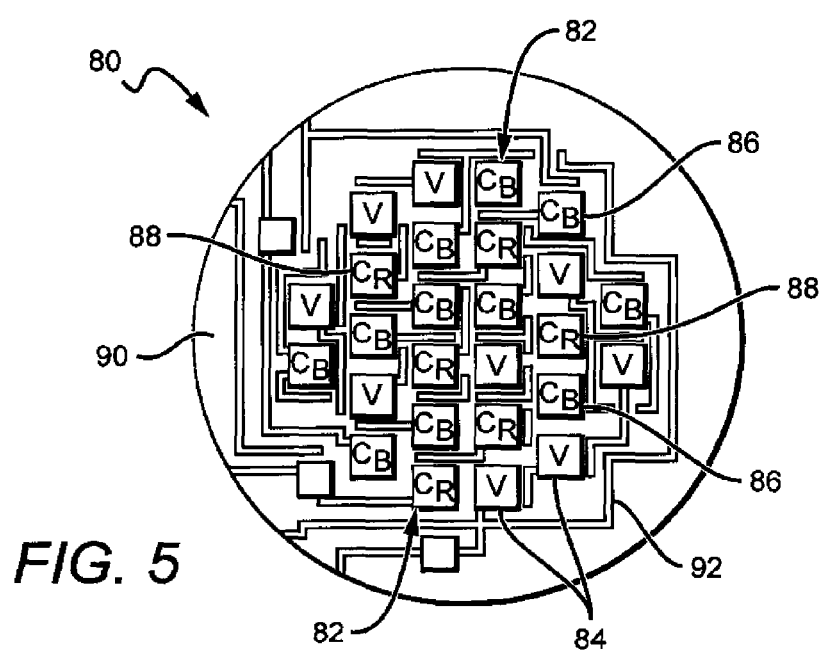
FIG. 5 is a plan view of one embodiment of an SSL luminaire light engine according to the present invention.

FIG. 5 shows one embodiment of a light engine 80 according to the present invention that can comprise a plurality of LED chips emitting light that mixes to provide the desired emission characteristics for the light engine 80. In this embodiment the LED chips comprise a control group of LED chips ($C_B$ and $C_R$) 82 and a variable group of LED chips (V) 84. As discussed above, the control group of LED chips 82 can comprise a plurality of LED chip types emitting different colors of light, with the ratio of emission intensity of the different types of LED chips in the control group remaining constant. The variable group of LED chips 84 can comprise one or more types of LED chips emitting different colors of light, whose emission intensity can be varied in relation to the control group of LED chips to change the color temperature of emission from the light engine 80.

In light engine 80 the control group of LED chips 82 can comprise a plurality of BSY LED chips ($C_B$) 86 and a plurality red emitting LED chips ($C_R$) 88. It is understood that other light engine embodiments can have a single BSY LED chip or a single red emitting LED chip. As described above, the BSY LED chips 86 can comprise blue LEDs coated by a yellow phosphor, with the yellow phosphor absorbing blue light and emitting yellow light. In one embodiment the blue LEDs can emit light having a dominant wavelength range of about 430 nm to 480 nm, and in some embodiments from about 450 nm to 460 nm. In still other embodiments the blue LEDs can emit a peak dominant wavelength of about 450 nm. The blue LEDs can be covered with sufficient amount of yellow phosphor such that the desired amount of blue LED light is absorbed by the yellow phosphor, with the BSY LED chips emitting the desired amount of blue light from the LED and yellow light from the phosphor. Many different blue LEDs can be used in the BYS LED chips 86 that can be made of many different semiconductor materials, such as materials from the Group-III nitride material system. LED structures, features, and their fabrication and operation are generally known in the art and accordingly are not discussed herein.

Many different yellow phosphors can be used in the BSY LED chips 86 such as commercially available YAG:Ce phosphors, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Some additional yellow phosphors that can be used in LED chips 82 can include:

$Tb_{3-x}RE_xO_{12}$:Ce(TAG); RE=Y, Gd, La, Lu; or
$Sr_{2-x-y}Ba_xCa_ySiO_4$:Eu.

The blue LEDs in the BSY LED chips 86 can be coated with the yellow phosphor using many different methods, with one suitable method being described in U.S. patent applications Ser. Nos. 11/656,759 and 11/899,790, both entitled "Wafer Level Phosphor Coating Method and Devices Fabricated Utilizing Method", and both of which are incorporated herein by reference. Alternatively the LED chips can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that other conventional coating methods can be used, including but not limited to spin coating.

In addition to the BYS LED chips 86, the control group of LED chips 82 can also comprise red emitting LED chips ($C_R$) 88. These can comprise conventional red emitting LEDs, such as red emitting AlInGaP based LED chips. The red emitting LED chips 88 can also comprise an LED coated by a red conversion material such as a red phosphor. The red LED chips 88 can comprise different LEDs with some embodiments comprising blue or ultraviolet (UV) emitting LED, although it is understood that LED emitting different colors can also be used. In these embodiments, the LEDs can be covered by a red phosphor in an amount sufficient to absorb the LED light and re-emit red light. Many different phosphors can be used in the LEDs chips 88, including but not limited to:

$Lu_2O_3$:$Eu^{3+}$
$(Sr_{2-x}La_x)(Ce_{1-x}Eu_x)O_4$
$Sr_2Ce_{1-x}Eu_xCeO_4$
$Sr_{2-x}Eu_xCeO_4$
$SrTiO_3$:$Pr^{3+}$, $Ga^{3+}$
$CaAlSiN_3$:$Eu^{2+}$
$Sr_2Si_5N_8$:$Eu^{2+}$

The LEDs used in LED chips 88 can also be fabricated using known methods such as those used for to fabricate LED chips 86 and can be coated using the methods described above.

For both the control and variable groups of LED chips 82, 84 different factors determine the amount of LED light that can be absorbed by the yellow and red conversion materials, and accordingly determines the necessary amount of conversion material needed in each. Some of these factors include but are not limited to the size of the phosphor particles, the type of binder material, the efficiency of the match between the type of phosphor and wavelength of emitted LED light, and the thickness of the phosphor/binding layer.

Different sized phosphor particles can also be used including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. The phosphors in the LED chips 82, 84 can also have different concentrations or loading of phosphor materials in the binder, with a typical concentration being in range of 30-70% by weight. In some embodiment, the phosphor concentration can be approximately 65% by weight, and can be uniformly dispersed throughout the phosphor coatings, although it is understood that in some embodiments it can be desirable to have phosphors in different concentrations in different regions. The appropriate thickness of the phosphor coating over the LEDs in the control and variable groups of LED chips 82, 84 can be determined by taking into account the above factors in combination with the luminous flux of the particular LEDs.

FIG. 6 is a graph 100 showing the emission characteristics for one embodiment of the control group LED chips according to the present invention. The blue light emission peak 102 from the blue LED emission in the BSY LED chips is at approximately 450 nm, and the yellow emission peak 104 from the phosphor of the BSY LED chips is at approximately 550 nm. The red emission peak 106 from the red LED chips is at approximately 625 nm.

Referring again to FIG. 5, emission intensity of the variable LED chips 84 can be varied to vary the color temperature of light emitted by the light engine 80. As mentioned above, the variable LED chips 84 can comprise one LED chip type emitting one color of light, or multiple LED chip types with each type emitting a different color of light. In light engine 80, the variable LED chips 84 comprise blue emitting LED chips comprising blue emitting LEDs that can be made from known semiconductor material systems, such as the Group-III nitride material system, and can be fabricated using known methods.

FIG. 7 is a graph 110 showing the emission characteristics from one embodiment of the variable group of LED chips according to the present invention. The variable group can emit blue light peak emission 112 for the variable group of LED chips being approximately 485 nm. Arrow 114 shows that the emission intensity of the second variable control group of LED chips can be varied to vary the light engine emission characteristics.

Referring again to FIG. 5, the control and variable LED chips 82, 84 can be mounted to a submount, substrate or printed circuit board (PCB) 90 ("submount") that can have conductive traces 92 that can connect the LED chips in different serial and parallel arrangements. The submount 90 can be formed of many different materials with a preferred material being electrically insulating, such as a dielectric. The submount 90 can also comprise ceramics such as alumina, aluminum nitride, silicon carbide, or a polymeric material such as polyimide and polyester etc. In some embodiments the submount 90 can comprise a material having a high thermal conductivity such as with aluminum nitride and silicon carbide. In other embodiments the submount 90 can comprise highly reflective material, such as reflective ceramic or metal layers like silver, to enhance light extraction from the component. In other embodiments the submount 90 can comprise a printed circuit board (PCB), sapphire, silicon carbide or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board. The size of the submount 90 can vary depending on different factors, with one being the size and number of LED chips 82, 84.

The submount 90 can also comprise die pads that along with the conductive traces 92 can be many different materials such as metals or other conductive materials. In one embodiment they can comprise copper deposited using known techniques such as plating and can then be patterned using standard lithographic processes. In other embodiments the layer can be sputtered using a mask to form the desired pattern. In some embodiments according to the present invention some of the conductive features can include only copper, with others including additional materials. For example, the die pads can be plated or coated with additional metals or materials to make them more suitable for mounting of LED chips. In one embodiment the die pads can be plated with adhesive or bonding materials, or reflective and barrier layers. The LED chips can be mounted to the die pads using known methods and materials such as using conventional solder materials that may or may not contain a flux material or dispensed polymeric materials that may be thermally and electrically conductive. In some embodiments wire bonds can be included, each of which passes between one of the conductive traces 92 and one of the LED chips 82, 84 and in some embodiment an electrical signal is applied to the LED chips 82, 84 through its respective one of the die pads and the wire bonds.

As discussed above, the desired emission of the light engine 80 can be provided with the combined emission of the control and variable LED chips 82, 84. In one embodiment according to the present invention the ratio of emission for the different LED chips in the control group 82 is held constant. That is, the emission intensity of the BSY LED chips 86 remains constant compared to the emission intensity of the red chips 88. In different embodiments the emission of the BSY chips 86 and red chips 88 can account for different percentages of overall emission for control group of emitters and the combination of light from the BSY and red LED chips can generate light of different temperature and the ratio of emission between the BSY and red LED chips remains constant. In some embodiments according to the present invention, lumens from the BSY chips 86 can comprise approximately 60-90% emission, for the control group of LED chips, and lumens from the red chips 88 can comprise approximately 10-40% of the emission from the control group of LED chips. In one embodiment the BSY LEDs and red LEDs emit approximately 79% and 21%, respectively, of the emission for the first group of emitters. The overall emission from the control group can also have a temperature in the range of approximately 1500 to 4000K, with one embodiment having a color temperature of approximately 2700K.

As also discussed above, the emission intensity of the LED chips 84 in the variable group of LED chips can be varied to change the color temperature emitted by the light engine 80. Blue emitting LED chips can be used for the variable LED chips 84 in different embodiments different blue LED chips can be used that emit different wavelengths of blue light. The intensity of the blue LED chips can be increased so that blue light is added to the overall emission of the light engine 80. That is, the ratio of light from the blue LED chips is increased in ratio to the emission from the control LED chips 82. The addition of the blue light increases the CCT of the light emitted by the LED engine 80.

The wavelength of blue light from the blue LED chips should be chosen so that the mixed light produced by the light engine 80 remains within a standard deviation of the BBL as the color temperature is increased. In one embodiment, the mixed light should remain with an approximate 0.10 delta u'v' of the BBL (tangential) and as the CRI Ra should remain as good as possible across the entire CCT range. In another embodiment, the light should remain with a 0.01 delta u'v' of the BBL with the same optimized CRI Ra.

Figure 8:
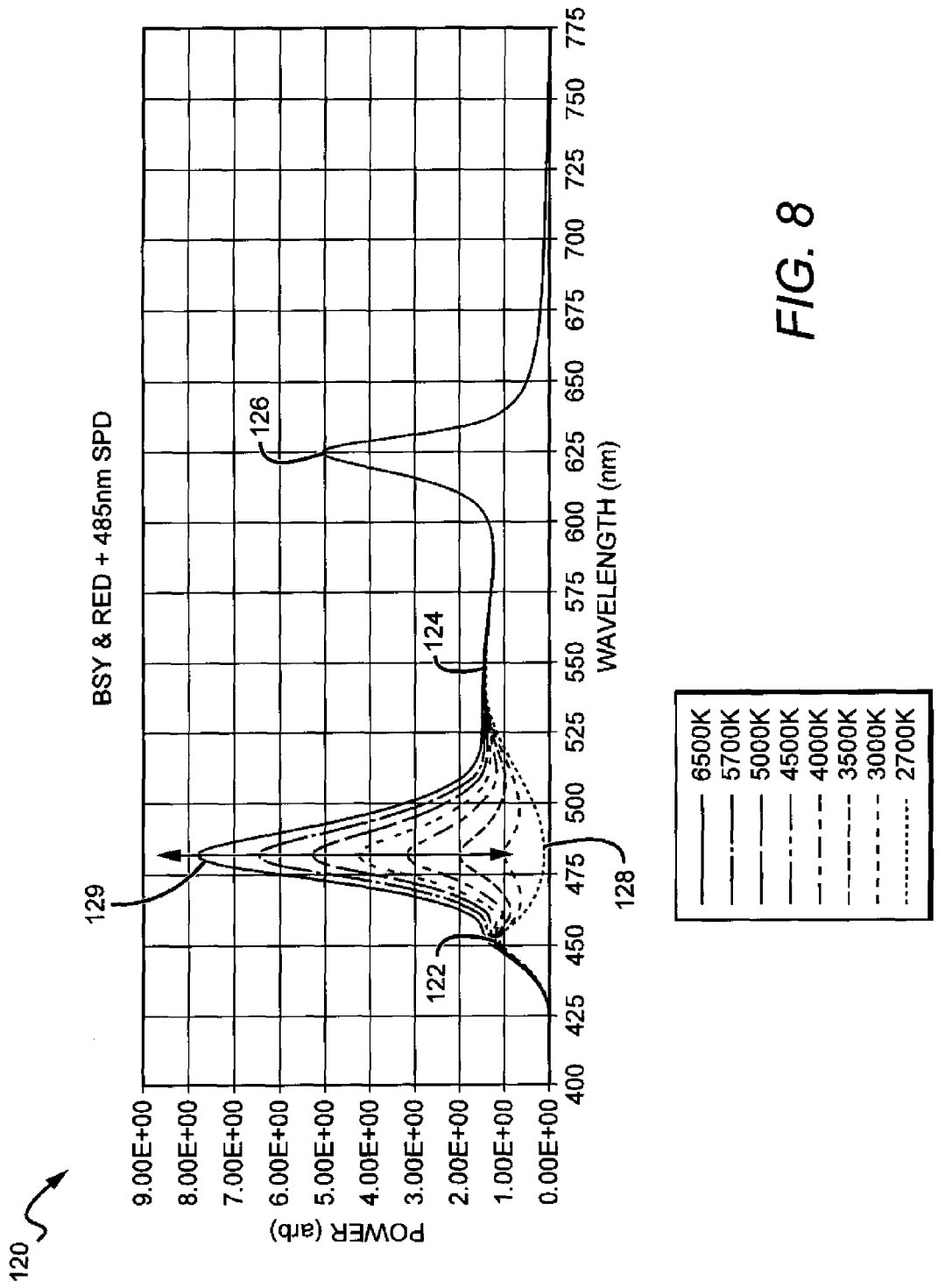
FIG. 8 is a graph showing the emission characteristics of one embodiment of a light engine according to the present invention.

FIG. 8 is a graph 120 showing the combined emission characteristics for the control and variable LED chips 82, 84 in one embodiment of a light engine 80 according to the present invention. The peak emission from the control group of LEDs is provided as blue and yellow peaks 122, 124 from the BSY LED chips and red peak 126 from the red LED chips. The emission from the variable group of LED chips is shown as blue peak 127, with the intensity of the blue emission varying. The light from the control group of LEDs remains generally constant, while the intensity of blue light is varied with respect to the control group of LED chips to vary the color temperature of the light engine. The lowest emission intensity 128 for the variable group of LED chips (essentially zero emission) is for light engine emission temperature of approximately 2700K. For this particular wavelength of blue light from the variable group, the increasing emission intensities of the blue light corresponds to light engine emission temperatures of 3000, 3500, 4000, 4500, 5000, and 5700. In the embodiment shown, the highest emission intensity 129 for the variable group of LED chips is for light engine color temperature of approximately 6500K.

Figure 10:
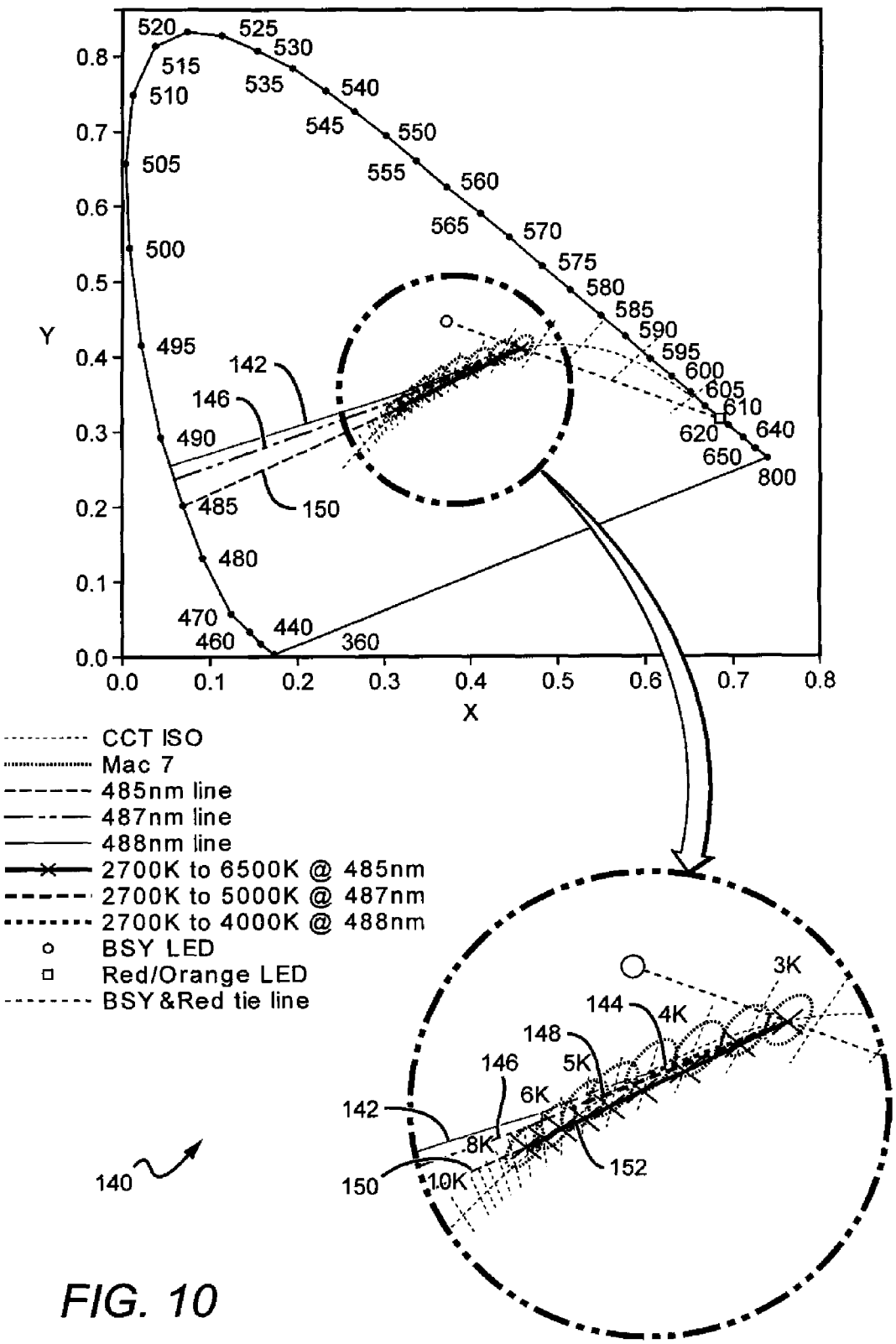
FIG. 10 is a CIE graph showing the emission characteristics for three embodiments of light engines according to the present invention.

FIGS. 9 and 10 show the emission characteristics for three embodiments of light engines according to the present invention that utilize blue emitting LED chips of differing peak emission wavelengths for their variable LED chips. FIG. 9 is a table 130 listing the emission characteristics for three different light engines and FIG. 10 is a CIE chart 140 showing the emission characteristics for the different embodiments. Referring to FIG. 9, the first embodiment 132 comprises blue LED chips emitting light in the range of 484 to 491 nm, with the optimum wavelength being 488 nm. This optimum emission is shown by emission line 142 in FIG. 10. The maximum percentage of lumens provided by the blue LED in the light engine is approximately 15%. This allows for a range of CCT for the light engine of approximately 2725 to 4000k depending on the emission intensity of the blue LEDs up to 15%. For this range of temperatures the CCT remains with 0.009 delta u'v' of the BBL through this range of CCTs, while maintaining a minimum CRI Ra Of 72. This is shown as temperature emission line 144 in FIG. 10.

The characteristics of a second embodiment 134 are shown having a similar range of wavelengths for the blue variable LED chips of 484 to 491 nm with an optimum wavelength being 487nm. This optimum emission is shown as emission line 146 in FIG. 10. In this embodiment the maximum percentage lumens provided by the blue LED chips is approximately 25%. This arrangement provides for a greater variable CCT range of 2725 to 5000K while remaining within 0.009 delta u'v' as shown by temperature emission line 148 in FIG. 10. This, however, results in an emission with a lower CRI Ra of 60. Accordingly, this embodiment allows for a greater temperature range but with a reduced CRI Ra.

The characteristics of a third embodiment 136 are shown having blue variable LED chips with a range of emissions from 484 to 487 nm, with an optimum emission for 484 nm. This optimum emission is shown as emission line 150 in FIG. 10. In this embodiment the maximum percentage lumens provided by the blue LED chips is approximately 27% of the overall emission from the light engine. This arrangement provides for an even greater variable CCT range of 2725 to 6000K while remaining within 0.009 delta u'v' as shown by temperature emission line 152 in FIG. 10. This, however, results in an emission with a lower CRI Ra of 60. Accordingly, this embodiment allows for even a greater temperature range but with a further reduced CRI Ra.

It is understood that different types of blue LEDs emitting at different optimum wavelengths can be used to achieve the desired light engine range of wavelengths within a desired standard deviation from the BBL. The three discussed above are only examples of different blue emitters that can be used and should not be construed as limiting.

As mentioned above, the variable group of LED chips can comprise more than one group of LED types, with each group emitting a different wavelength of light. In some embodiments, the ratio of light between the different types of LEDs can remain constant, with the ratio of light provided by the variable group of LEDs chips in the light engine being varied in relation to the control group of LED chips to vary the color temperature of the light emitted by the light engine. This multiple LED type arrangement is particularly applicable to light engines having an increased CRI Ra.

Figure 11:
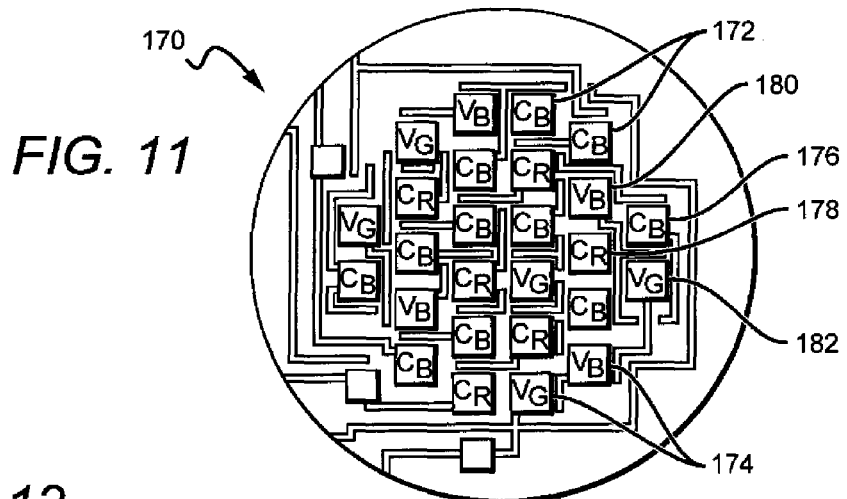
FIG. 11 is a plan view of another embodiment of a light engine according to the present invention.

FIG. 11 shows another embodiment of a light engine 170 according to the present invention that is similar to the light engine 80 shown in FIG. 5 and described above. The light engine 170 can comprise a control group of LED chips 172 and a variable group of LED chips 174. Like light engine 80 in FIG. 5, the control group of LED chips 172 in light engine 170 can comprise BSY chips 176 and red chips 178. As discussed above regarding light engine 80, the variations of blue light from the variable group of LED chips 84 in FIG. 5 provide for a range of color temperatures within an acceptable deviation of the BBL. In some embodiments the increase in blue light can also result in a lower CRI Ra. One potential reason for this reduced CRI Ra is the excess red from the control group of LED chips. One way to offset this red is to include lighting content in the variable group of LED chips that offsets the red light. Different embodiments of the variable group of LED chips can comprise multiple types of LED chips that can offset the red light to reduce or eliminate this reduction in CRI.

For the light engine 170, the variable group of LED chips can comprise blue emitting LED chips ($V_B$) 180 and green emitting LED chips ($V_G$) 182. The green from the green emitting LED chips 182 can compensate for the red in the control group of LED chips to minimize the reduction of CRI with increases in the ratio of blue emission through the desired range of color temperatures. In some embodiments, the blue and green LED chips 180, 182 can maintain the same ratio of emission between them so that there is no need to increase the control required to vary the CCT of the light engine 170.

Figure 12:
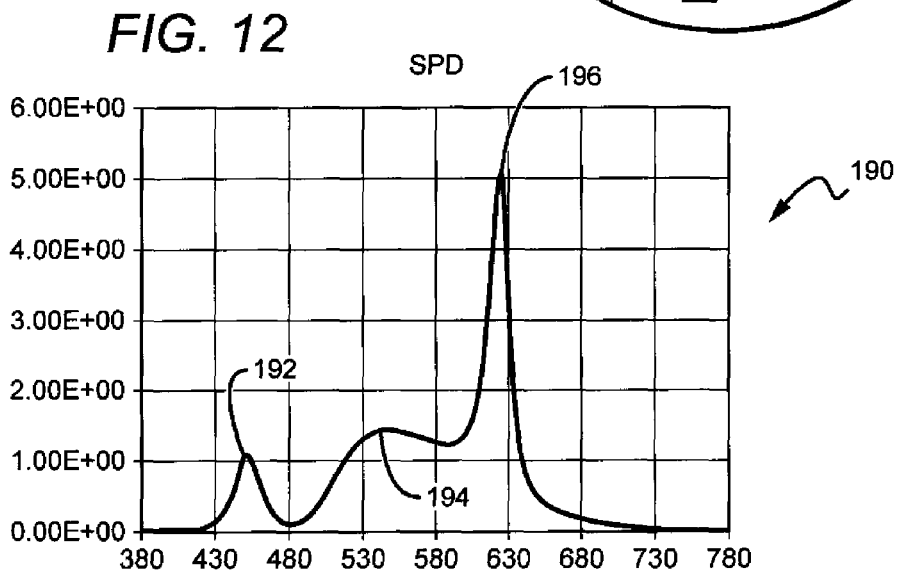
FIG. 12 is a graph showing the emission characteristics for the control group of LED chips according to the present invention.

FIG. 12 is a graph 190 showing the emission characteristics from the control group of LED chips 170 that are similar to the emission characteristics for control group of LED chips 82 as shown in FIG. 6 and described above. Blue and yellow peaks 192, 194 are generated by the BSY emitters at approximately 450 nm and 550 nm, respectively. The red emission peak 196 from the red LED chips is at approximately 625 nm.

Figure 13:
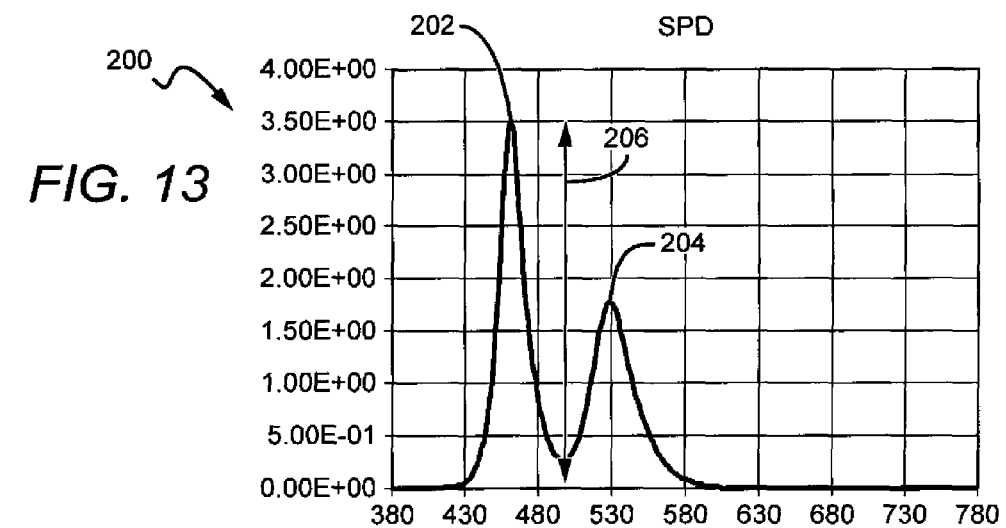
FIG. 13 is a graph showing the emission characteristics for another embodiment of the variable group of LED chips according to the present invention.

FIG. 13 is a graph 200 showing the emission characteristics for the variable group of LED chips. The peak blue emission 202 is provided at approximately 460 nm by the blue LED chips. The peak green emission 204 is provided at approximately 530 nm by the green LED chips. The arrow 206 shows that the emission intensity of the blue and green LED chips can be varied to vary the color temperature of the light engine 170, with the emission of the two varying that same in ratio to each other.

Figure 14:
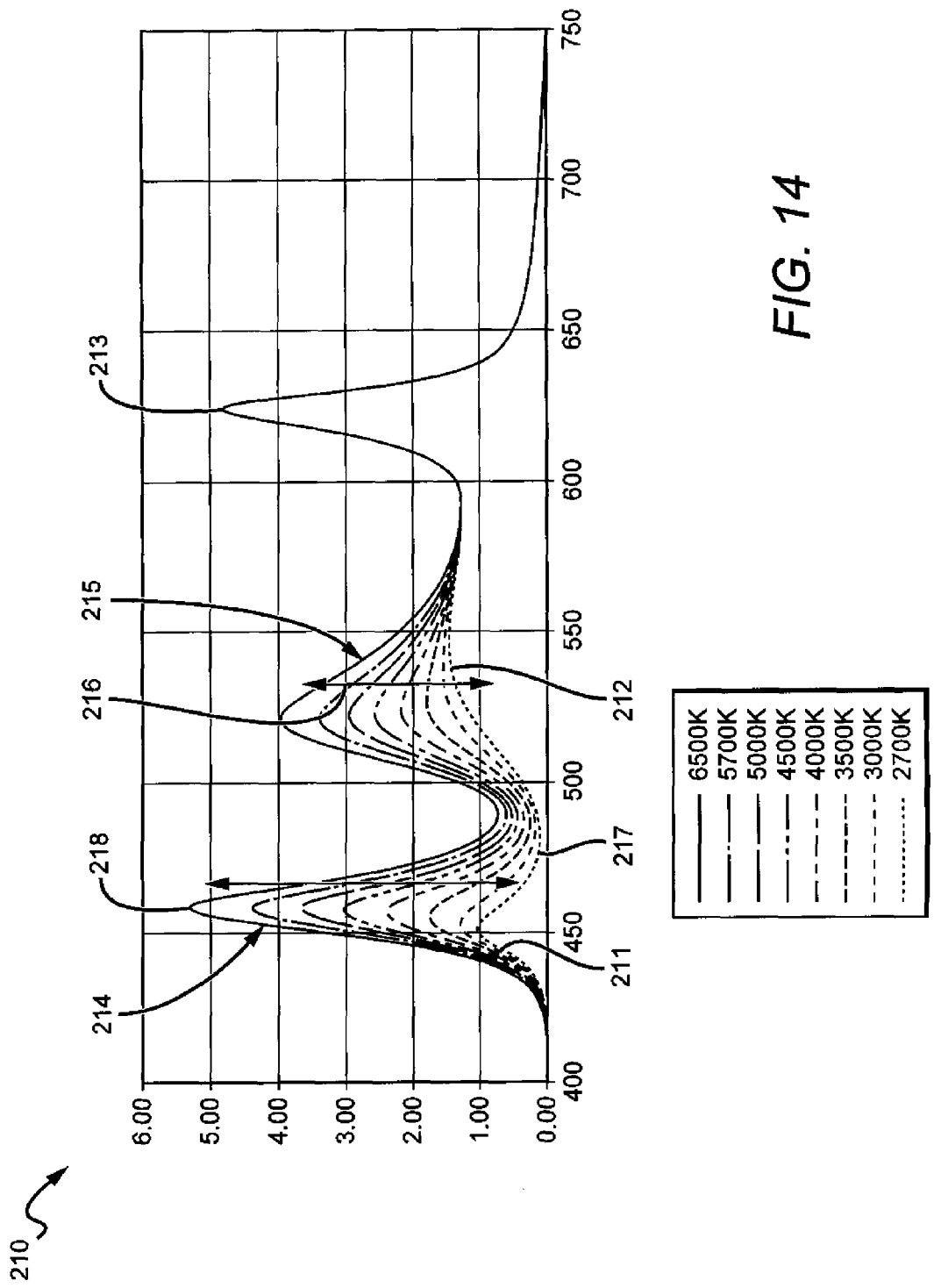
FIG. 14 is a graph showing the emission characteristics for another embodiment of a light engine according to the present invention.

FIG. 14 is a graph 210 showing the combined emission characteristics for the control and variable LED chips in light engine 170. The blue, yellow and red peaks 211, 212 and 213 correspond to light from the BSY and red LED chips for the control group of LED chips as shown in FIG. 12 above. The variable blue and green emissions 214, 215 are contributed from the variable group of LED chips as shown in FIG. 13. The arrows 216 show that the emission intensities of the blue and green LED chips can vary to vary the color temperature of the light engine emission. The lowest emission intensity 217 for the variable group of LED chips (essentially zero emission) is for light engine emission temperature of approximately 2700K. For this particular wavelength of blue and green light from the variable group, the increasing emission intensities of the blue and green light corresponds to light engine emission temperatures of 3000, 3500, 4000, 4500, 5000, and 5700. In the embodiment shown, the highest emission intensity 218 for the variable group of LED chips is for light engine color temperature of approximately 6500K.

Figure 15:
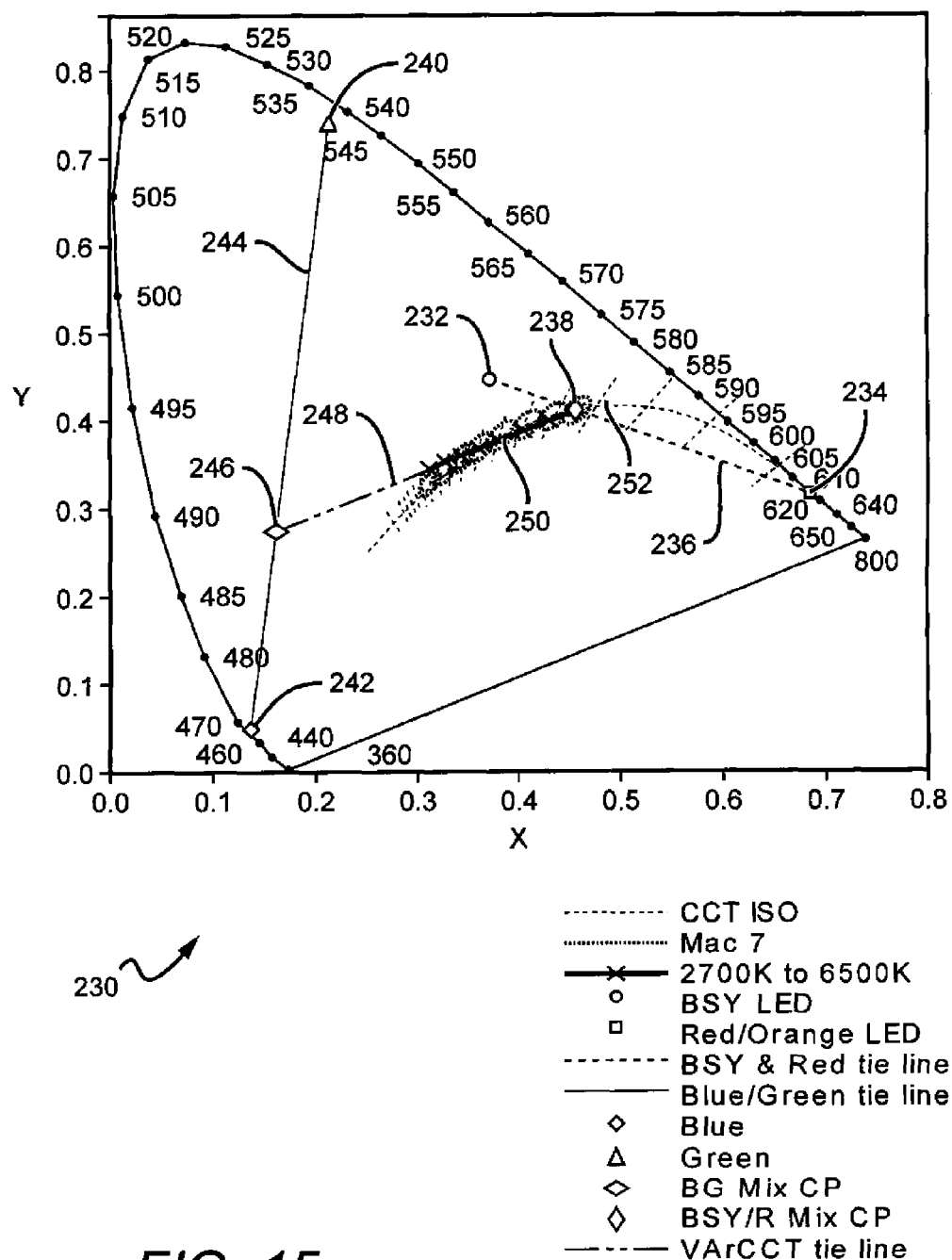
FIG. 15 is a CIE graph showing the emission characteristics for another embodiment of a light engine according to the present invention.
Figures 16, 25:
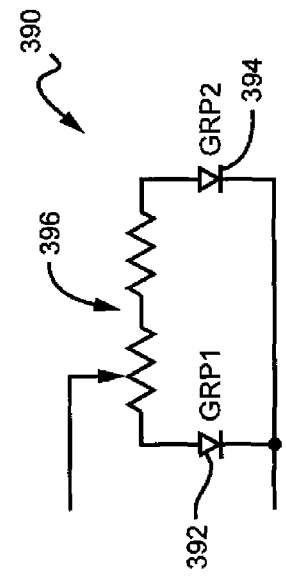
FIG. 16 is a table showing the emission characteristics for another embodiment of a light engine according to the present invention.
FIG. 25 is a circuit diagram for still another embodiment of a light engine according to the present invention.

FIGS. 15 and 16 show the emission characteristics for one embodiment of a light engine according to the present invention having BSY and red LED chips for the control group of LED chips and blue and green LEDs chips for the variable group of LED chips. FIG. 15 is a CIE chart 230 showing the BSY and red LED chip emission points 232, 234 with a BSY and red tie line 236 between the two showing the different emission points that can result from the combination of the BSY and red LED chips emissions. In this embodiment the emission combines to generate control group color point 238. The color points from the variable group of LED chips is shown as green color point 240 and blue color point 242 with tie line 244 between the two showing the possible different points for combination of light from the green and blue LED chips. In this embodiment, light from the green and blue LED chips combines to the variable LED chips color point 246.

Light engine tie line 248 shows the different color points that can be realized by combining light from the control and variable LED chips. In this embodiment, the ratio of blue and green light from the variable group of LED chips remains constant, but the intensity of the combined light can vary along tie line 248. The tie line 248 includes a white emission portion 250 that is within a desired deviation of the BBL 252. In this embodiment the standard deviation is less than 0.01 delta u'v' of the BBL, which provides a temperature range within the deviation of approximately 2700 to 6500K.

Referring now to FIG. 16, is a table 260 some of the emission characteristics for this embodiment of a light engine are listed. The CRI Ra of the light engine is improved compared to light engine 80 described above. In particular, the CRI Ra varies between its lowest point of 90.1 at a color temperature of 4500K and its highest point of 92.7 at a color temperature of 2700K. Throughout the range of color temperatures the delta u'v' varies between 0.000002 and 0.009667, all of which are below the target threshold of 0.01 delta u'v'.

The different control and variable LED chips can be arranged in many different ways beyond the two embodiments above. In one embodiment the control or variable groups of LED chips could comprise one type of emitter coated by different phosphors to achieve the desired color point. For example, the control LED chips could comprise blue emitting LEDs with a yellow phosphor and a red phosphor. Similarly, the variable group of LED chips could comprise blue LEDs coated by a green phosphor (BSG LEDs). In one embodiment the blue LEDs can emit light in the wavelength range of 440 nm to 480 nm, and can be coated with the green phosphor using the different methods described above. Many different phosphors can be used to provide the desired color point combination of blue and green light including but not limited to:

$SrGa_2S_4$:Eu;
$Sr_{2-y}Ba_ySiO_4$:Eu; or
$SrSi_2O_2N_2$:Eu.

The phosphor materials can be included in a binder material in the different concentrations described above for the yellow phosphor, such as 30-60% by weight. The particles can also have different sizes such as in the range of 10 to 30 mm. As also discussed above, in different embodiments the phosphor can be uniformly distributed over the blue LEDs or can have different concentrations in different regions.

Figure 17:
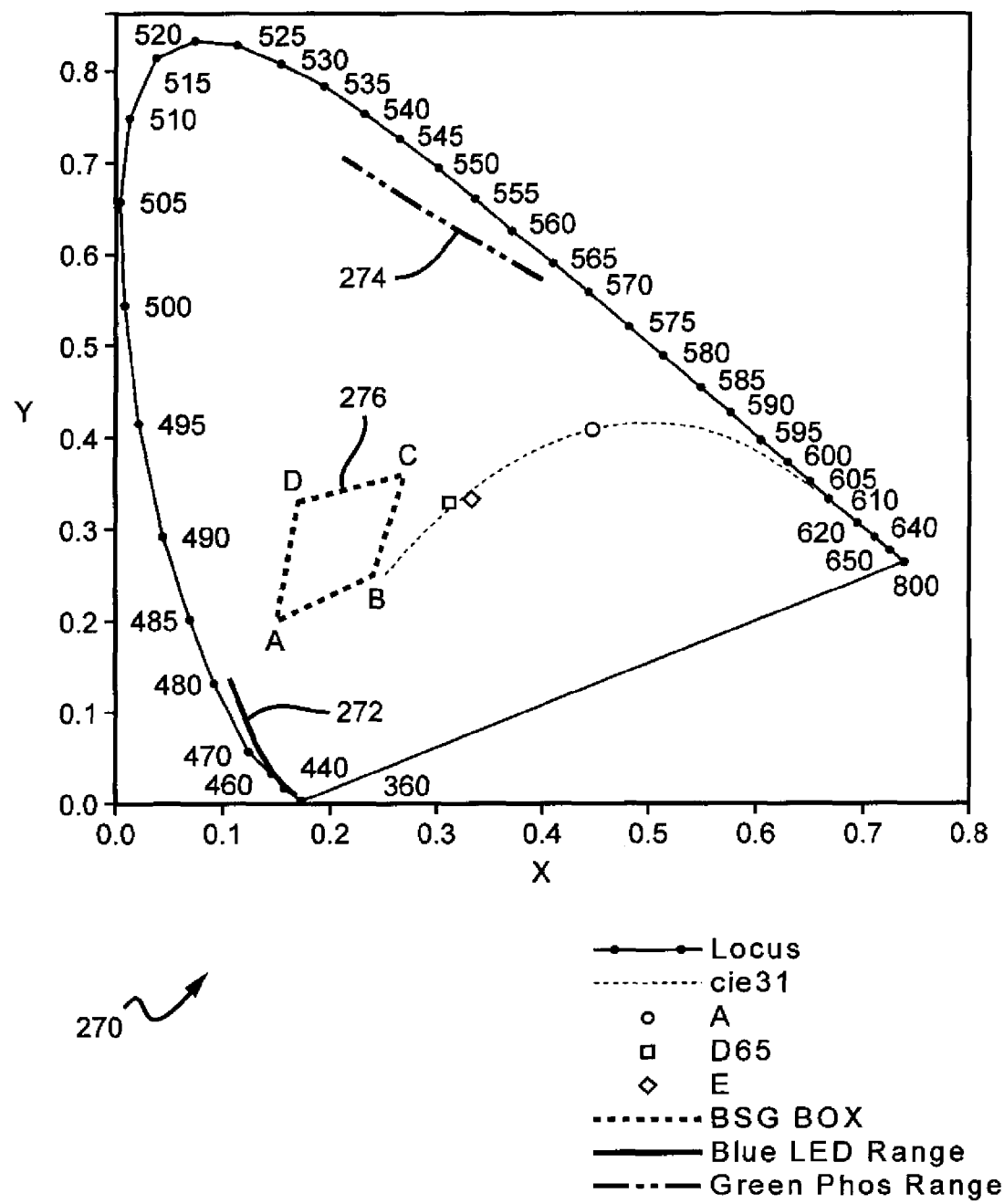
FIG. 17 is a CIE graph showing the emission characteristics for other embodiments of LED chips according to the present invention.

FIG. 17 is a CIE diagram 270 showing the emission ranges for a variable group of LED chips comprising a blue LED coated by a green phosphor. The blue LED emission wave is shown by the blue emission line 272 with emissions ranging from approximately 440 nm to 480 nm. The green phosphor emission is shown by green emission line 274 showing emissions ranging from 535 to 565 nm. A suitable combined area of emission for one embodiment of BSG LEDs according to the present invention is shown by emission BSG box 276, with the box coordinates at each corner. The BSG LED can emit at a color point within the box 276, and in the embodiment shown the box 276 forms a first CIE color space created by the following approximate CIE diagram coordinates:

| Point | x | y |
| --- | --- | --- |
| A | 0.15 | 0.20 |
| B | 0.25 | 0.29 |
| C | 0.29 | 0.40 |
| D | 0.17 | 0.33 |

Figure 18:
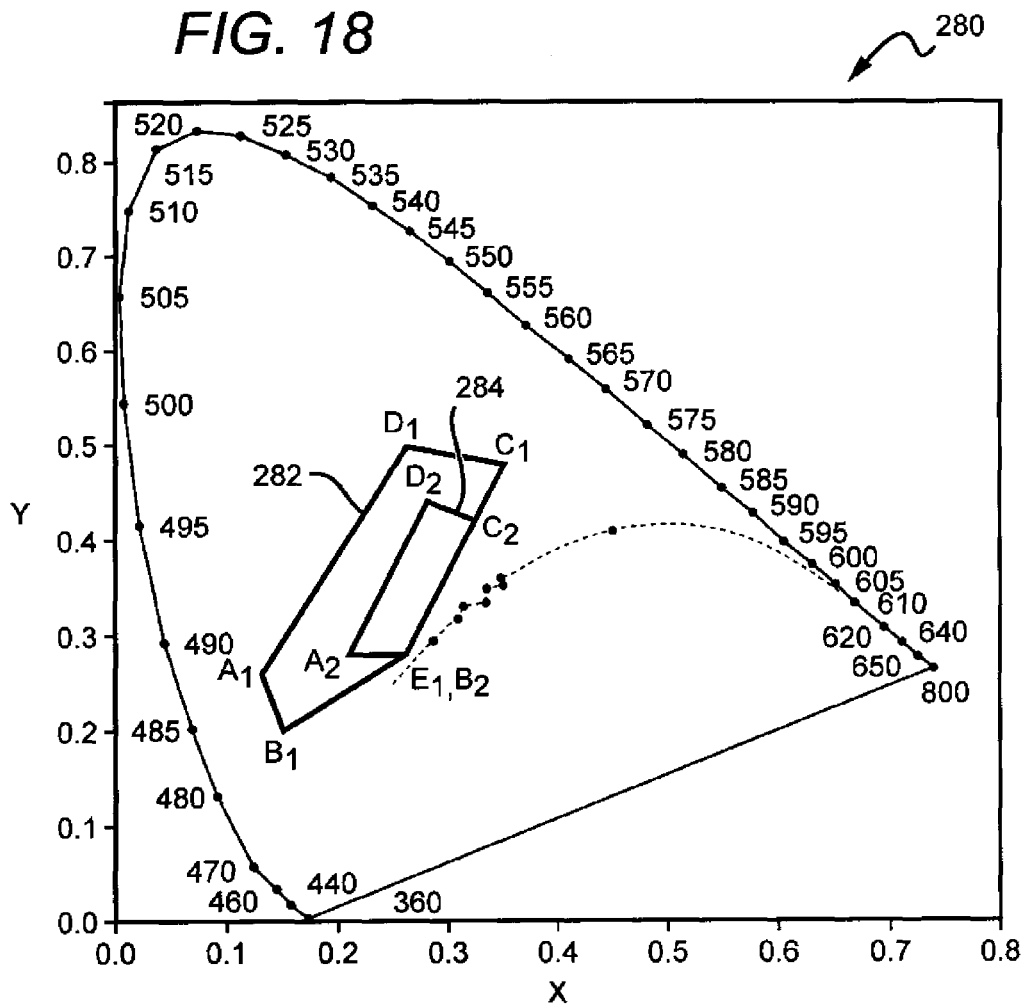
FIG. 18 is another CIE graph showing the emission characteristics for still other embodiments of LED chips according to the present invention.

It is understood that different BSG LEDs according to the present invention provide emissions within different color spaces having many different shapes and sizes beyond those shown in FIG. 17. FIG. 18 shows another CIE diagram 280 showing second and third CIE color spaces 282, 284 according to the present invention. The second color space 282 is defined by five points and has the following approximate CIE coordinates:

| Point | x | y |
| --- | --- | --- |
| $A_1$ | 0.13 | 0.26 |
| $B_1$ | 0.15 | 0.20 |
| $C_1$ | 0.35 | 0.48 |
| $D_1$ | 0.26 | 0.50 |
| $E_1$ | 0.26 | 0.28 |

The third color space 284 is defined by four points and has the following approximate CIE coordinates:

| Point | x | y |
| --- | --- | --- |
| $A_2$ | 0.21 | 0.28 |
| $B_2$ | 0.26 | 0.28 |
| $C_2$ | 0.32 | 0.42 |
| $D_2$ | 0.28 | 0.44 |

The third color space 284 covers an area within second color space 282, and it is understood that other color space embodiments according to the present invention can cover different areas within the second color space 282. For example, the coordinates for other color spaces can cover the area of the second color space. That is, these alternative embodiments can have coordinates between those of the first and second color spaces. The A coordinates from alternative embodiments can have an x coordinate in the range of 0.13 to 0.21 and y coordinate in the range of 0.26 to 0.28. Similarly, the B coordinates can have an x coordinate in the range of 0.15 to 0.26 and a y coordinate in the range of 0.20 to 0.28. The C coordinates can have an x coordinate in the range of 0.32 to 0.35 and y coordinates in the range of 0.42 to 0.48, and the D coordinates can have an x coordinate in the range of 0.26 to 0.28 and a y coordinate in the range of 0.44 to 0.50. The alternative boxes can also have 5 or more coordinate points to give the boxes many different shapes. It is also understood that the alternative embodiments can have many other boxes with other x, y coordinates and can comprise color spaces that cover different areas some of with can be at least partially outside of the second color space 282.

Control LEDs can also be included and can comprise many different types of LED chips. In one embodiment they can comprise BSY and red as shown in FIG. 15 and described above. The particular emission point within the particular BSG box can be combined with the emission point of the control group of LED chips to provide the desired light engine emission. As embodiment shown in FIG. 15, the emission intensity of the BSG variable LED chips can be varied to vary the temperature of the light engine emission within a certain range with emission remaining within an acceptable deviation of the BBL through the temperature ranges. In one embodiment the acceptable deviation is 0.01 delta u'v', although it is understood that many other deviations can used up to 0.10 delta u'v' or more.

In alternative embodiments according to the present invention, the BSG LED chips can comprise the control group of LED chips, and in some embodiments the emission from the BSG chips can be at a point within any one of the CIE color spaces described above. The emission from the BSG chips can provide color that falls above the black body locus (BBL) on the CIE diagram and the red or reddish LEDs chips provide a light that falls below the BBL. The light from the BSG LED chips can be combined with light from the red or reddish LED chips that "pull" the color point of the BSG chips to BBL to produce desired temperature of white light.

The light emitted from the red LED chips can have many different wavelengths and in one embodiment the emission can be in the range of 600 to 660 nm dominant. In another embodiment, the red LED chips can have a wavelength in the range of 605 to 625 nm dominant. For high quality light sources the combined illumination of the BSG and red LED chips should produce a color of the illumination that is as close as possible to that of the BBL. As mentioned above, one such standard deviation is measured in terms of a MacAdam ellipse with one embodiment of a suitable proximity to the BBL being within a 10-tep MacAdam ellipses. In other embodiments a suitable proximity can be within a 4-step MacAdam ellipse.

The combination of light from the BSG and red LED chips can provide a light with a CCT ranging from 2500 to 20000K. In some embodiments, this range can be achieved with light having a CRI Ra of greater than or equal to 75. In some embodiments the light can exhibit a CCT of approximately 2700K at medium to good CRE. In still other embodiments, light from the BSG and red LED chips can have a CRI Ra of greater than or equal to 90 and can have a CCT in the range of approximately 3500 to 15000K.

In these embodiments, the emission from the BSG and red control LED chips can be combined with that of the variable LED chips to vary the temperature of the light engine emission within a certain range while keeping the light within an acceptable deviation of the BBL, such a 0.01 delta u'v', or up to 0.10 delta u'v' or more. In one embodiment, the variable LEDs can comprise blue emitting LED chips, while in other embodiments the variable LED chips can comprise different types of LED chips to provide the desired overall emission variation. As with the embodiments described above, the intensity of the variable LED chips can be varied to change the color temperature within the desired range.

It is understood that the control and variable group of LED chips can comprise many different LED types of LED chips arranged in different ways and emitting different colors of light beyond those described above. The three embodiments described above are only examples of the many different arrangements that can be provided according to the present invention.

Figure 19:
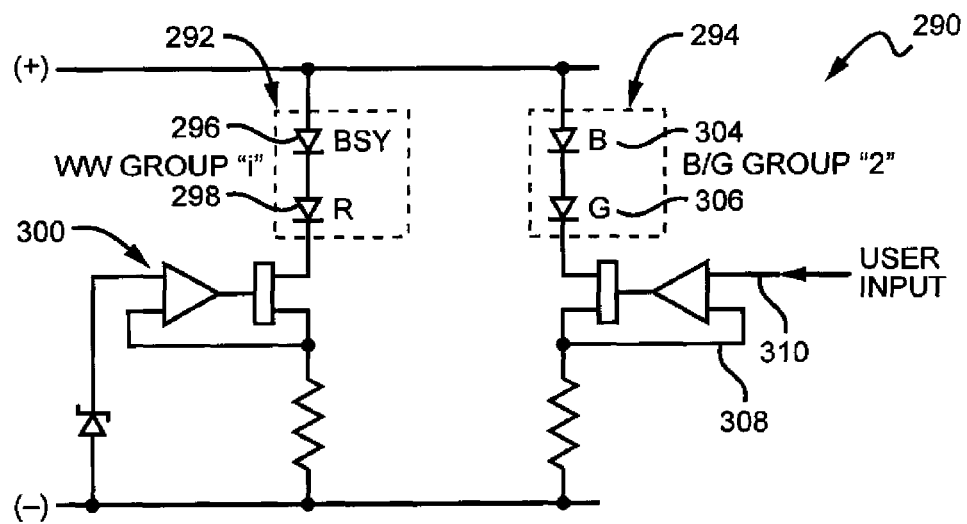
FIG. 19 is a circuit schematic for one embodiment of a light engine according to the present invention.

The control and variable groups of LED chips can be provided in many different circuit arrangements according to the present invention. FIG. 19 shows one embodiment of circuit schematic light engine 290 according to the present invention comprising a control group of LED chips 292 and a variable group of LED chips 294. The control LED chips 292 comprise BSY and red LED chips 296, 298 that can are shown couple in series, but that can be coupled together in different parallel and serial arrangements. The desired number of BSY and red LED chips 296, 298 is provided to give the desired emission ratio for the different colors of light. A constant drive signal is applied to the control group of LED chips 292 through control input circuit 300. The variable group of LED chips 294 comprises blue and green LEDs 304, 306 that can be coupled in together in different series and parallel connections. The desired number of blue and green LEDs 304, 306 can be included to provide the desired ratio of light between the two. A drive signal can be applied to the variable LED chips 294 through variable input circuit 308, with the drive signal being varied based on the input 310. This in turn varies the emission intensity of the variable LED chips 294 to vary the color temperature of the light engine 290 as described above.

Figure 20:
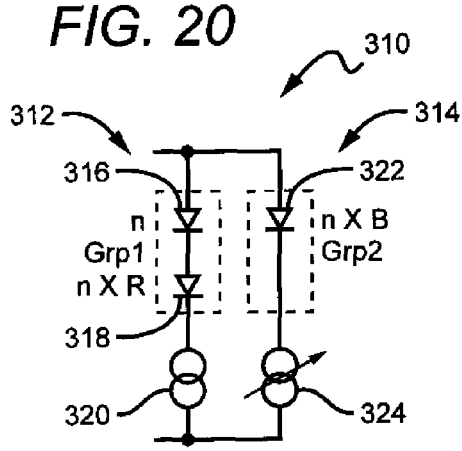
FIG. 20 is a circuit schematic for another embodiment of a light engine according to the present invention.
Figure 21:
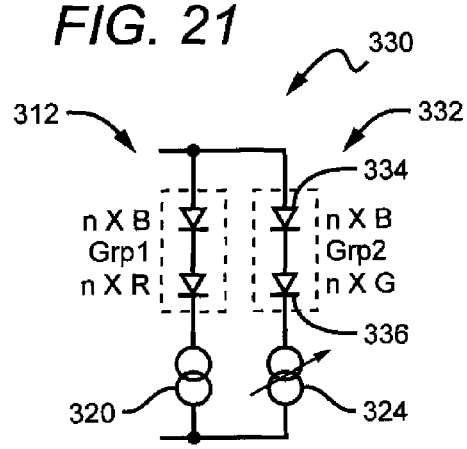
FIG. 21 is a circuit schematic for another embodiment of a light engine according to the present invention.
Figure 22:
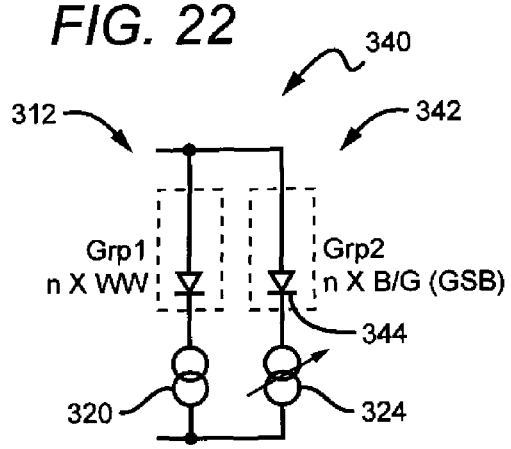
FIG. 22 is a circuit schematic for another embodiment of a light engine according to the present invention.

FIGS. 20-22 show different embodiments of light engine circuits according to the present invention having a fixed drive signal applied to the control group of LED chips and a variable signal applied to the variable group of LED chips. Referring now to FIG. 20, the light engine circuit 310 comprises a control group of LED chips 312 and a variable group of LED chips 314. The control group of LED chips 312 comprises a plurality of BSY LED chips 316 and red LED chips 318 connected in series to constant current source 320. The variable group of LED chips 314 comprises a plurality of blue LED chips 322 connected to a variable current source 324. The current applied to the control group of LEDs 320 from the constant current source 320 provides for a generally (absent any effects of temperature and degradation over time) constant emission intensity of the BSY and red LED chips 316, 318. The variable current source 324 allows for the emission intensity of the blue LED chips 322 to be varied to vary the emission color temperature of the light engine.

FIG. 21 shows a light engine circuit 330 having the same control group of LED chips 312 coupled to a constant current source 320 so that the emission of the control group is constant. A variable current control 324 is coupled to a variable group of LED chips 332 that comprise serially connected blue emitting LED chips 334 and green emitting LED chips 336. Like above, the variable current source 324 allows for the emission intensity of the blue and green emitting LEDs 334, 336 to be varied to vary the emission color temperature of the light engine. This arrangement also allows for the ratio of emission from the green and blue LED chips to remain constant.

Referring now to FIG. 22, a light engine circuit 340 is shown having the same control group of LED chips 312 coupled to a constant current source 320 so that the emission of the control group is constant. A variable current control 324 is coupled to a variable group of LED chips 342 that comprises plurality of serially connected green phosphor coated blue LEDs chips 344. Like above, the variable current source 324 allows for the emission intensity of the blue and green light from the LED chips 344 to be varied to vary the emission color temperature of the light engine.

Figure 23:
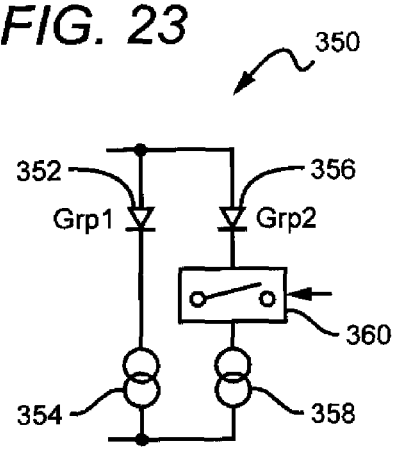
FIG. 23 is a circuit diagram for one embodiment of a light engine according to the present invention utilizing a switching mechanism.

It is understood that in other embodiments according to the present invention the light engines can be arranged to provide light at one of two different temperatures. In these embodiments, a switching arrangement can be provided that allows for the switching on and off of the variable group of LED chips to switch between the two colors temperatures. FIG. 23 shows a light engine circuit 350 having a control group of LED chips 352 coupled to a first constant current source 354, and a variable group of LED chips 356 coupled to a second constant current source 358. A switch 360 is arranged between the variable LED chips 356 and the constant current source 360 to the variable group of LEDs on and off. Opening the switch 360 turns off the variable LED chips 356 and causes the light engine emission at one temperature. Closing the switch 360 turns on the variable LED chips and causes the light engine emission at another temperature.

Figure 24:
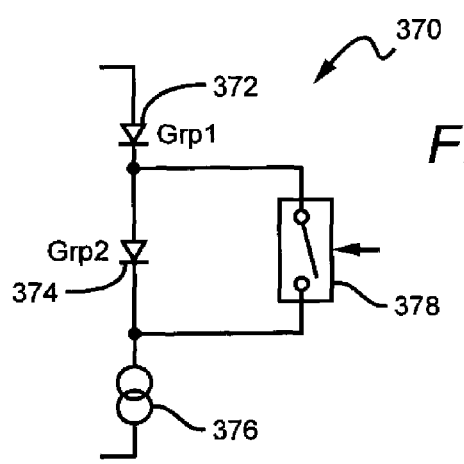
FIG. 24 is a circuit diagram for another embodiment of a light engine according to the present invention also utilizing a switching mechanism.

FIG. 24 shows another embodiment of a light engine circuit 370 according to the present invention having a control group of LED chips 372 coupled in series with a variable group of LED chips 374 and a constant current source 376. A switch 378 is coupled in parallel with the variable LED chips 374 so that when the switch 378 is closed, current bypasses the variable LED chips 374 through the closed switch. This causes light engine emission at one temperature. When the switch 378 is open, current flows through the variable LED chips 374 causing them to emit light. This causes the light engine to emit at a second color temperature. These are only two of the many different switching arrangements that can be provided according to the present invention.

FIG. 25 shows another embodiment of a light engine circuit 390 according to the present invention comprising a control group of LED chips 392 and a variable group of LED chips 394. The circuit also comprises a variable resistance mechanism 396 that can be manipulated to vary the current passing through the control and variable groups of LED chips 392, 394. This in turn varies the emission intensity between the two groups to vary the temperature of the light engine emission as described above.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. Therefore, the spirit and scope of the invention should not be limited to the versions described above.

We claim:
1. A solid state luminaire comprising:
  a control group of solid state emitters comprising first and second solid state emitters emitting at different wavelengths; and
  a variable group of solid state emitters, the combination of light from said control and variable groups causing emission within a standard deviation of the black body locus (BBL) in a CIE graph, the varying of emission intensity of said variable group of emitters causing the emission of the combined light from said control and variable emitters to vary within a range of color temperatures while emitting within said standard deviation of the BBL.

2. The luminaire of claim 1, wherein the emission point of said first solid state emitter is above the BBL in a CIE graph and the emission of said second solid state emitter is below the BBL.

3. The luminaire of claim 1, wherein said first solid state emitter comprises a blue shifted yellow (BSY) solid state emitter.

4. The luminaire of claim 1, wherein said second solid state emitter comprises a red emitting solid state emitter.

5. The luminaire of claim 1, wherein the ratio of emission between said first and second solid state emitters remains approximately constant when the emission from said variable emitters is varied.

6. The luminaire of claim 1, wherein said variable emitters comprise blue emitting solid state emitters.

7. The luminaire of claim 1, wherein said variable emitters comprise different types of emitters emitting at different colors of light.

8. The luminaire of claim 7, wherein the ratio of light from said different types of emitters remains constant as the emission of said variable group of emitters is varied.

9. The luminaire of claim 1, wherein said variable emitters comprise blue emitting solid state emitters and green emitting solid state emitters.

10. The luminaire of claim 1, wherein said variable emitters each comprise solid state emitter having a blue solid state emitter coated by a green phosphor.

11. The luminaire of claim 1, wherein the emission point from said variable group of emitters is to the left on the CIE graph of the emission points from said first and second solid state emitters.

12. The luminaire of claim 1, wherein the CRI of the combined emission from said control and variable groups has a CRI greater than 90 through said range of color temperatures.

13. The luminaire of claim 1, wherein said standard deviation is 0.01 delta u'v' of said BBL.

14. The luminaire of claim 1, wherein said range of color temperatures is approximately 2700 to 4000K.

15. The luminaire of claim 1, wherein said range of color temperatures is approximately 2700 to 5000K.

16. The luminaire of claim 1, wherein said range of color temperatures is approximately 2700 to 6500K.

17. The luminaire of claim 1, wherein said variable group of emitters emits light having a wavelength of approximately 488 nm and said range of color temperatures is approximately 2700 to 4000K.

18. The luminaire of claim 1, wherein said variable group of emitters emits light having a wavelength of approximately 487 nm and said range of color temperatures is approximately 2700 to 5000K.

19. The luminaire of claim 1, wherein said variable group of emitters emits light having a wavelength of approximately 485 nm and said range of color temperatures is approximately 2700 to 6500K.

20. The luminaire of claim 1, wherein said variable group of emitters comprises first and second emitters emitting wavelengths of light at 460 nm and 530 nm, and said range of color temperatures is approximately 2700 to 6500K.

21. A solid state luminaire comprising:
a control group of solid state emitters having a first emitter emitting light at a color point above the black body locus (BBL) in a CIE graph and a second emitter emitting light at a color point below the BBL; and
a variable group of emitters whose emission intensity can be varied to vary the combined emission of said control and variable emitters along a range of color temperatures while maintaining said emission within a standard deviation of a BBL.

22. The luminaire of claim 21, wherein said combination of light from said first and second emitters combines to a color point within a standard deviation of said BBL.

23. The luminaire of claim 21, wherein said first emitter comprises a blue shifted yellow (BSY) solid state emitter.

24. The luminaire of claim 21, wherein said second emitter comprises a red emitting solid state emitter.

25. The luminaire of claim 21, wherein the ratio of emission between said first and second solid state emitter remains approximately constant when the emission from said variable emitters is varied.

26. The luminaire of claim 21, wherein said variable emitters comprise blue emitting solid state emitters.

27. The luminaire of claim 21, wherein said variable emitters comprise different types of emitters emitting at different colors of light.

28. The luminaire of claim 27, wherein the ratio of light from said different types of emitters remains constant as the emission of said variable group of emitters is varied.

29. The luminaire of claim 21, wherein said variable emitters comprise blue emitting solid state emitters and green emitting solid state emitters.

30. The luminaire of claim 21, wherein said variable emitters each comprise solid state emitters having a blue solid state emitter coated by a green phosphor.

31. The luminaire of claim 21, wherein the emission point from said variable group of emitters is to the left on the CIE graph of the emission points from said first and second emitters.

32. The luminaire of claim 21, wherein said standard deviation is 0.01 delta u'v' of said BBL.

33. The luminaire of claim 21, wherein said variable group of emitters emits light having a wavelength of approximately 488 nm and said range of color temperatures is approximately 2700 to 4000K.

34. The luminaire of claim 21, wherein said variable group of emitters emits light having a wavelength of approximately 487 nm and said range of color temperatures is approximately 2700 to 5000K.

35. The luminaire of claim 21, wherein said variable group of emitters emits light having a wavelength of approximately 485 nm and said range of color temperatures is approximately 2700 to 6500K.

36. The luminaire of claim 21, wherein said variable group of emitters comprise first and second emitters emitting wavelengths of light at 460 nm and 530 nm, and said range of color temperatures is approximately 2700 to 6500K.

37. The luminaire of claim 21, further comprising a switching mechanism to switch the emission of said variable group of emitters on and off.

38. A method for varying the emission from a luminaire, comprising:
providing emission from a first source at a first color point within a standard deviation of the black body locus (BBL) on a CIE graph, said first source comprising first and second solid state emitters emitting at different wavelengths that combine to said color point; and
providing emission from a second source whose emission intensity is variable to vary the emission of said luminaire along a range of emissions all of which are within a standard deviation of said black body locus.

39. The method of claim 38, wherein said first source comprises first and second solid state emitters wherein said first solid state emitter emits light above the BBL in a CIE graph and said second solid state emitter is below the BBL, the emission from said first and second solid state emitters combining to said first color point.

40. The method of claim 38, wherein said first source comprises a blue shifted yellow (BSY) solid state emitter and a red emitting solid state emitter.

41. The method of claim 40, wherein the ratio of emission between said first and second solid state emitter remains approximately constant through emission variation of said second source.

42. The method of claim 38, wherein said second source comprises solid state emitter emitting at approximately the same wavelength.

43. The method of claim 38, wherein said second source comprises different types of emitters emitting at substantially different wavelengths of light.

44. The method of claim 38, wherein the second source emits light at a second color point that is to the left of said first color point on the CIE graph.

45. The method of claim 38, wherein said standard deviation is 0.01 delta u'v' of said BBL.

46. The method of claim 38, wherein said range of color temperatures is at least 2700 to 4000K.

47. A light engine, comprising:
a first group of solid state emitters comprising a first emitter emitting above the black body locus (BBL) in a CIE diagram, and a second emitter emitting below the BBL, the combination light from said first and second emitters generating an emission color point within a standard deviation of said BBL; and
a second group of solid state emitters, the combination of light from said first and second groups of emitters causing emission within a standard deviation of the black body locus (BBL), wherein varying the intensity of the second group of emitters causes emission from said first and second emitters to vary within a range of color temperatures while still emitting within said standard deviation of the BBL.

48. A light engine, comprising:
a blue shifted green (BSG) solid state emitter comprising a blue solid state emitter coated by a green phosphor, said green phosphor absorbing at least some of the blue light emitting from said blue solid state emitter and emitting green light; and
a red emitting solid state emitter, the combination of light from the BSG solid state emitter and red solid state emitter generating a light with a color point within a standard deviation of the black body locus (BBL) of a CIE diagram.

49. The light engine of claim 48, wherein said BSG solid state emitter emits light having x, y color coordinates which define a point which is within an area on a 1931 CIE Chromaticity Diagram enclosed by color space defined by a plurality of line segments that connect a first point having x, y coordinates of 0.13,0.26, second point having x, y coordinates of 0.15, 0.20, third point having x, y coordinates of 0.35, 0.48, fourth point having x, y coordinates of 0.26, 0.50, and fifth point having x, y coordinates of 0.26, 0.28.

50. The light engine of claim 49, wherein said standard deviation comprises a ten step Macadam ellipse.

51. The light engine of claim 49, wherein said standard deviation comprises a four step Macadam ellipse.

52. The light engine of claim 49, wherein said red emitter emits light within the wavelength range of 600 to 660 nm.

53. The light engine of claim 49, wherein said red emitter emits light within the wavelength range of 605 to 625 nm.

54. The light engine of claim 49, having a CRI Ra of greater than or equal to 90 and a correlated color temperature in the range of 3500 to 15,000K.

55. The light engine of claim 49, having a CRI Ra of greater than or equal to 75 and a correlated color temperature in the range of 2500 to 20,000K.

56. The light engine of claim 49, further comprising a variable solid state emitter whose emission intensity can be varied to vary the combined emission of said BSG solid state emitters and red solid state emitters, said variable emitter along a range of color temperatures while maintaining said emission within a standard deviation of said BBL.

57. A solid state luminaire comprising:
a control group of solid state emitters comprising a blue shifted green (BSG) solid state emitter and a red solid state emitter; and
a variable group of solid state emitters, the combination of light from said control and variable groups causing emission within a standard deviation of the black body locus (BBL) in a CIE graph, the varying of emission intensity of said variable group of emitters causing the emission of the combined light from said control and variable emitters to vary within a range of color temperatures while emitting within said standard deviation of the BBL.

58. The solid state luminaire of claim 57, wherein said BSG solid state emitter emits light having x, y color coordinates which define a point which is within an area on a 1931 CIE Chromaticity Diagram enclosed by color space defined by a plurality of line segments that connect a first point having x, y coordinates of 0.13, 0.26, second point having x, y coordinates of 0.15, 0.20, third point having x, y coordinates of 0.35, 0.48, fourth point having x, y coordinates of 0.26, 0.50, and fifth point having x, y coordinates of 0.26, 0.28.

59. The solid state luminaire of claim 57, wherein said red emitter emits light within the wavelength range of 600 to 660 nm.

60. A solid state luminaire comprising:
a control group of solid state emitters; and
a variable group of solid state emitters comprising blue shifted green (BSG) solid state emitters, the combination of light from said control and variable groups causing emission within a standard deviation of the black body locus (BBL) in a CIE graph, the varying of emission intensity of said variable group of emitters causing the emission of the combined light from said control and variable emitters to vary within a range of color temperatures while emitting within said standard deviation of the BBL.

61. The solid state luminaire of claim 60, wherein said BSG solid state emitters emits light having x, y color coordinates which define a point which is within an area on a 1931 CIE Chromaticity Diagram enclosed by color space defined by a plurality of line segments that connect a first point having x, y coordinates of 0.13, 0.26, second point having x, y coordinates of 0.15, 0.20, third point having x, y coordinates of 0.35, 0.48, fourth point having x, y coordinates of 0.26, 0.50, and fifth point having x, y coordinates of 0.26, 0.28.

* * * * *